United States Patent
Heo et al.

(10) Patent No.: US 10,121,854 B2
(45) Date of Patent: *Nov. 6, 2018

(54) ELECTRONIC DEVICE INCLUDING SIDE GATE AND TWO-DIMENSIONAL MATERIAL CHANNEL AND METHOD OF MANUFACTURING THE ELECTRONIC DEVICE

(71) Applicant: Samsung Electronics Co., Ltd., Suwon-si, Gyeonggi-do (KR)

(72) Inventors: Jinseong Heo, Seoul (KR); Kiyoung Lee, Seoul (KR); Jaeho Lee, Seoul (KR); Seongjun Park, Seoul (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/605,057

(22) Filed: May 25, 2017

(65) Prior Publication Data

US 2017/0330935 A1 Nov. 16, 2017

Related U.S. Application Data

(62) Division of application No. 14/932,395, filed on Nov. 4, 2015, now Pat. No. 9,735,233.

(30) Foreign Application Priority Data

Apr. 7, 2015 (KR) .................. 10-2015-0049214

(51) Int. Cl.
*H01L 29/78* (2006.01)
*H01L 29/06* (2006.01)
(Continued)

(52) U.S. Cl.
CPC ...... *H01L 29/0665* (2013.01); *H01L 21/2253* (2013.01); *H01L 29/0649* (2013.01);
(Continued)

(58) Field of Classification Search
CPC ............ H01L 29/0665; H01L 29/0649; H01L 29/41733; H01L 29/4236; H01L 29/42384;
(Continued)

(56) References Cited

U.S. PATENT DOCUMENTS 9,064,777 B2 6/2015 Heo et al.
9,105,556 B2 8/2015 Heo et al.
(Continued)

FOREIGN PATENT DOCUMENTS

JP H1029446 A 11/1998
JP H10294466 11/1998
(Continued)

OTHER PUBLICATIONS

L. Britnell et al. "Field-Effect Tunneling Transistor Based on Vertical Graphene Heterostructures". Science 335: AAAS. 2012. pp. 947-950.
(Continued)

*Primary Examiner* — Fazli Erdem
(74) *Attorney, Agent, or Firm* — Harness, Dickey & Pierce, P.L.C.

(57) ABSTRACT

Provided are electronic devices and methods of manufacturing same. An electronic device includes an energy barrier forming layer on a substrate, an upper channel material layer on the substrate, and a gate electrode that covers the upper channel material layer and the energy barrier forming layer. The gate electrode includes a side gate electrode portion that faces a side surface of the energy barrier forming layer. The side gate electrode may be configured to cause an electric
(Continued)

field to be applied directly on the energy barrier forming layer via the side surface of the energy barrier forming layer, thereby enabling adjustment of the energy barrier between the energy barrier forming layer and the upper channel material layer. The electronic device may further include a lower channel material layer that is provided on the substrate and does not contact the upper channel material layer.

34 Claims, 31 Drawing Sheets

(51) Int. Cl.
- H01L 21/225 (2006.01)
- H01L 29/423 (2006.01)
- H01L 29/66 (2006.01)
- H01L 29/417 (2006.01)
- H01L 29/786 (2006.01)

(52) U.S. Cl.
CPC .... *H01L 29/41733* (2013.01); *H01L 29/4236* (2013.01); *H01L 29/42384* (2013.01); *H01L 29/66477* (2013.01); *H01L 29/78* (2013.01); *H01L 29/785* (2013.01); *H01L 29/78648* (2013.01); *H01L 29/78681* (2013.01); *H01L 29/78684* (2013.01); *H01L 29/78687* (2013.01); *H01L 29/78696* (2013.01)

(58) Field of Classification Search
CPC . H01L 29/66477; H01L 29/78; H01L 29/785; H01L 29/78648; H01L 29/78681; H01L 29/78684; H01L 29/78687; H01L 29/78696; H01L 21/2253
See application file for complete search history.

(56) References Cited

U.S. PATENT DOCUMENTS

| | | | |
|---|---|---|---|
| 9,166,062 B2 | 10/2015 | Lee et al. | |
| 2008/0173864 A1 | 7/2008 | Fujita et al. | |
| 2010/0102292 A1* | 4/2010 | Hiura | B82Y 10/00 |
| | | | 257/9 |
| 2010/0258787 A1 | 10/2010 | Chae et al. | |
| 2012/0049160 A1* | 3/2012 | Sano | H01L 21/8213 |
| | | | 257/27 |
| 2013/0048948 A1 | 2/2013 | Heo et al. | |
| 2013/0048951 A1 | 2/2013 | Heo et al. | |
| 2013/0075700 A1 | 3/2013 | Yang et al. | |
| 2013/0175506 A1 | 7/2013 | Heo et al. | |
| 2013/0277644 A1 | 10/2013 | Seo et al. | |
| 2014/0014905 A1* | 1/2014 | Lee | H01L 29/78 |
| | | | 257/29 |
| 2014/0097403 A1 | 4/2014 | Heo et al. | |
| 2014/0097404 A1 | 4/2014 | Seo et al. | |
| 2014/0158989 A1 | 6/2014 | Byun et al. | |
| 2014/0264275 A1 | 9/2014 | Zhong et al. | |
| 2015/0014630 A1 | 1/2015 | Choi et al. | |
| 2015/0122315 A1 | 5/2015 | Shin et al. | |
| 2015/0171167 A1* | 6/2015 | Nourbakhsh | H01L 29/1606 |
| | | | 257/29 |
| 2015/0318401 A1* | 11/2015 | Duan | H01L 29/66742 |
| | | | 250/200 |
| 2015/0364545 A1 | 12/2015 | Heo et al. | |
| 2016/0020280 A1 | 1/2016 | Heo et al. | |
| 2016/0087042 A1 | 3/2016 | Lee et al. | |
| 2016/0141373 A1* | 5/2016 | Cantoro | H01L 29/267 |
| | | | 257/27 |
| 2017/0040443 A1* | 2/2017 | Lemaitre | B82Y 10/00 |

FOREIGN PATENT DOCUMENTS

| | | |
|---|---|---|
| JP | 2004039763 A | 2/2004 |
| JP | 2007103626 A | 4/2007 |
| KR | 2013-0022854 A | 3/2013 |
| KR | 20130032105 A | 4/2013 |
| KR | 20130081950 A | 7/2013 |
| KR | 20140010720 A | 1/2014 |
| KR | 20140045841 A | 4/2014 |
| KR | 20160010217 A | 1/2016 |
| WO | WO-2012127244 A2 | 9/2012 |

OTHER PUBLICATIONS

Demetrio Logoteta et al. "Graphene-based lateral heterostructure transistors exhibit better intrinsic performance than graphene-based vertical transistors as post-CMOS devices". Scientific Reports. 2014. pp. 1-8.

Jeong S. Moon et al. "Lateral Graphene Heterostructure Field-Effect Transistor". IEEE Electron Device Letters, vol. 34, No. 9. Sep. 2013. pp. 1190-1192.

\* cited by examiner

ELECTRONIC DEVICE INCLUDING SIDE GATE AND TWO-DIMENSIONAL MATERIAL CHANNEL AND METHOD OF MANUFACTURING THE ELECTRONIC DEVICE

CROSS-REFERENCE TO RELATED APPLICATION

This application is a divisional application of U.S. patent application Ser. No. 14/932,395, filed on Nov. 4, 2015, which claims the benefit under 35 U.S.C. § 119 of Korean Patent Application No. 10-2015-0049214, filed on Apr. 7, 2015, in the Korean Intellectual Property Office, the disclosure of which is incorporated herein in its entirety by reference.

BACKGROUND

1. Field

The present disclosure relates to an electronic device, and more particularly, to an electronic device including a side gate and a two-dimensional (2D) material channel, and a method of manufacturing the electronic device.

2. Description of the Related Art

Electronic devices may include one or more two-dimensional (2D) material layers, which may include graphene. Graphene has semi-metallic material characteristics. Accordingly, graphene may have a very low density of states at the Fermi level. Therefore, when electrons or holes are added or removed in graphene, the Fermi level of graphene may be changed.

However, when the Fermi level of graphene is far from the inherent Fermi level of graphene, a larger voltage may be required to be applied to a gate electrode to change the Fermi level of graphene.

For example, where an electronic device includes graphene and a gate electrode and a 1V voltage needs to be applied to the gate electrode to change the Fermi level of the graphene by 0.1 eV, a 3V voltage may need to be applied to the gate electrode to change the Fermi level of the graphene by another 0.1 eV. As a result, changing a work function of the graphene may be limited by the voltage which may be applied to the gate electrode to change an energy barrier between graphene and a semiconductor (or an insulating material) without resulting in damage to the electronic device.

For example, an electronic device which includes graphene may include an energy barrier which is limited to a range of Fermi levels which does not result in destruction to a gate insulating layer of the electronic device of approximately ±0.4 eV. The change in the energy barrier may determine a sub-threshold swing (SS) value of the graphene device. In some cases, the SS value of an electronic device which includes graphene may be approximately the same as an SS value of a current CMOS device (100 mV/dec).

SUMMARY

Provided is an electronic device has high mobility, a low operation voltage and a low sub-threshold swing (SS) value.

Provided is a method of manufacturing the electronic device.

Additional aspects will be set forth in part in the description which follows and, in part, will be apparent from the description, or may be learned by practice of the presented example embodiments.

According to some embodiments, an electronic device includes a substrate, an energy barrier forming layer on the substrate, an upper channel material layer on the substrate, a gate electrode that covers the upper channel material layer and the energy barrier forming layer, a drain electrode on the substrate, and a source electrode on the upper channel material layer. The upper channel material layer includes a two-dimensional (2D) material, a portion of the upper channel material layer covers an upper surface of the energy barrier forming layer, and the gate electrode includes a side gate electrode portion that faces a side surface of the energy barrier forming layer.

The electronic device may further include a lower channel material layer provided on the substrate. The lower channel material layer may be isolated from contact with the upper channel material layer, the lower channel material layer may be at least partially located between the energy barrier forming layer and the substrate, and the drain electrode may contact the lower channel material layer.

The electronic device may include an interlayer insulating layer. The substrate may include a semiconductor substrate that includes separate areas, each separate area associated with a different doping concentration, the interlayer insulating layer may be on a low doping concentration area of the separate areas, and at least a portion of the upper channel material layer and at least a portion of the source electrode may be on the interlayer insulating layer.

The electronic device may include an interlayer insulating layer. The substrate may include a semiconductor substrate that includes separate areas, each separate area of the semiconductor substrate may include a different doping concentration, the interlayer insulating layer may be buried in the semiconductor substrate, and the buried interlayer insulating layer may be in contact with a high doping concentration area of the separate areas of the semiconductor substrate.

The energy barrier forming layer may include a first material layer and a second material layer. One material layer of the first material layer and the second material layer may include a p-type material layer, and another material layer of the first material layer and the second material layer may include an n-type material layer.

The electronic device may further include a hole penetrating through at least a portion of each of the upper channel material layer and the energy barrier forming layer. The gate electrode may include a portion which faces a side surface of the energy barrier forming layer. The side surface may be exposed through the hole.

The electronic device may further include a hole penetrating through at least a portion of each of the upper channel material layer, the energy barrier forming layer, and the lower channel material layer. The gate electrode may include a portion which faces a side surface of the energy barrier forming layer. The side surface may be exposed through the hole.

The energy barrier forming layer may include a first material layer and a second material layer. One material layer of the first material layer and the second material layer may include a p-type material layer, and another material layer of the first material layer and the second material layer may include an n-type material layer.

The electronic device may further include an insulating layer between the substrate and the lower channel material layer.

A high doping concentration area of the separate areas of the semiconductor substrate may be located beneath a surface of the semiconductor substrate, and a portion of the upper channel material layer and a portion of the drain electrode may at least partially overlap the high doping concentration area.

The electronic device may further include a 2D material layer between the drain electrode and the substrate.

A portion of the semiconductor substrate may be located between a high doping concentration area of the separate areas of the semiconductor substrate and the upper channel material layer. The portion of the semiconductor substrate may include the energy barrier forming layer.

The first material layer and the second material layer may be horizontally arranged or vertically stacked.

The electronic device may further include a lower gate electrode that is buried in the insulating layer.

The energy barrier forming layer may include a first material layer and a second material layer. One material layer of the first material layer and the second material layer may include a p-type material layer, and another material layer of the first material layer and the second material layer may include an n-type material layer.

The first and second material layers may be vertically stacked, and the substrate or the gate electrode may be transparent with respect to light. In this case, the electronic device may be a light-emission diode (LED) or a solar battery.

According to some embodiments, an electronic device may be an inverter including a first semiconductor device and a second semiconductor device.

Each of the first and second semiconductor devices may include a substrate, an energy barrier forming layer on the substrate, an upper channel material layer on the substrate, a gate electrode that covers the upper channel material layer and the energy barrier forming layer, a first terminal on the substrate, and a second terminal on the upper channel material layer. The energy barrier forming layer of the first semiconductor device or the energy barrier forming layer of the second semiconductor device may include a p-type material layer, and the other may include an n-type material layer. Also, the first and second terminals of the first semiconductor device or the first and second terminals of the second semiconductor device are connected to each other, and the gate electrodes of the first and second semiconductor devices are connected to each other. The upper channel material layer includes a two-dimensional (2D) material, a portion of the upper channel material layer covers an upper surface of the energy barrier forming layer, and the gate electrode includes a side gate electrode portion that faces a side surface of the energy barrier forming layer.

The upper channel material layers of the first semiconductor device and the second semiconductor device may be connected to each other and form one body, and the second terminals of the first semiconductor device and the second semiconductor device may be connected to each other.

The first terminals of the first semiconductor device and the second semiconductor device may be connected to each other.

The electronic device may further include a lower channel material layer which is provided on the substrate and is isolated from contact with the upper channel material layer. The lower channel material layer may be at least partially located between the energy barrier forming layer and the substrate, and the drain electrode may contact the lower channel material layer.

The electronic device may further include an insulating layer between the substrate and the lower channel material layer. The electronic device may further include a lower gate electrode that is buried in the insulating layer.

According to some embodiments, a method of manufacturing an electronic device includes forming an energy barrier forming layer on a substrate, forming, on the substrate, an upper channel material layer that covers an upper surface of the energy barrier forming layer, forming a gate electrode that covers the energy barrier forming layer and the upper channel material layer, forming a drain electrode on the substrate, and forming a source electrode on the upper channel material layer. The upper channel material layer may include a two-dimensional (2D) material layer, and the gate electrode is formed such that a portion of the gate electrode faces a side surface of the energy barrier forming layer.

The method may further include forming a lower channel material layer on the substrate. A portion of the lower channel material layer may be formed between the energy barrier forming layer and the substrate, and the drain electrode is formed such that the drain electrode may contact the lower channel material layer.

The substrate may be a semiconductor substrate. The method may further include forming an area of the semiconductor substrate which includes a relatively high doping concentration in the semiconductor substrate, forming an interlayer insulating layer on an area of the semiconductor substrate which includes a relatively low doping concentration, and forming a portion of the upper channel material layer and the source electrode on the interlayer insulating layer.

The substrate may include a semiconductor substrate. The method may further include forming an area of the semiconductor substrate which includes a relatively high doping concentration in the semiconductor substrate, and burying an interlayer insulating layer in the semiconductor substrate.

The energy barrier forming layer may include a first material layer and a second material layer. One material layer of the first material layer and the second material layer may include a p-type material layer, and another material layer of the first material layer and the second material layer may include an n-type material layer.

The method may further include forming an insulating layer between the substrate and the lower channel material layer. The method may further include forming a buried gate electrode in the insulating layer.

The method may further include, before forming the gate electrode, forming a hole that penetrates through the upper channel material layer and the energy barrier forming layer. The gate electrode may be formed such that a portion of the gate electrode faces a side surface of the energy barrier forming layer which is exposed through the hole.

The method may further include, before forming the gate electrode, forming a hole that penetrates the upper channel material layer, the energy barrier forming layer, and the lower channel material layer. The gate electrode may be formed such that a portion of the gate electrode faces a side surface of the energy barrier forming layer which is exposed through the hole.

The upper and lower channel material layers may be formed by using at least one of a transfer printing method or a direct growth method.

The 2D material may include at least one of graphene, transition metal dichalcogenide (TMD), or molybdenite.

BRIEF DESCRIPTION OF THE DRAWINGS

These and/or other aspects will become apparent and more readily appreciated from the following description of some embodiments, taken in conjunction with the accompanying drawings in which.

Figure 1:
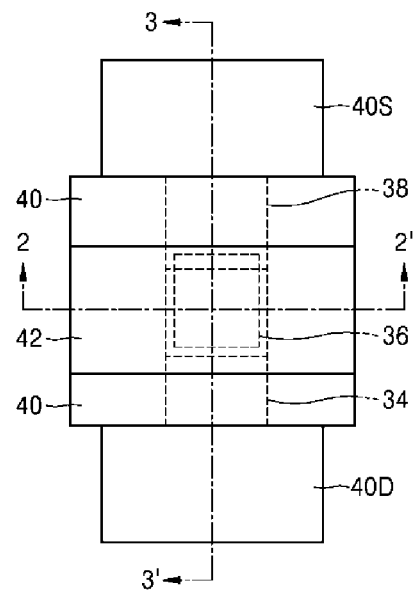
FIGS. 1, 2, and 3 are a plan view and cross-sectional views of an electronic device that includes a side gate and a two-dimensional (2D) material, according to some embodiments.

It should be noted that these figures are intended to illustrate the general characteristics of methods and/or structure utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments.

DETAILED DESCRIPTION

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Hereinafter, an electronic device that includes a side gate and a two-dimensional (2D) material channel and a method of manufacturing the electronic device will be described in detail with reference to exemplary embodiments, examples of which are illustrated in the accompanying drawings. In the drawings, the thicknesses of layers and regions are exaggerated for clarity.

FIG. 1 is a plan view of an electronic device that includes a side gate and a 2D material channel, according to some embodiments.

Referring to FIG. 1, the electronic device includes a source electrode 40S and a drain electrode 40D. The source electrode 40S is separate from the drain electrode 40D. A gate insulating layer 40 is between the source and drain electrodes 40S and 40D. The gate insulating layer 40 covers an area between the source and drain electrodes 40S and 40D. A gate electrode 42 is between the source and drain electrodes 40S and 40D. The gate electrode 42 may overlap the gate insulating layer 40. The gate insulating layer 40 may contact the source and drain electrodes 40S and 40D. The gate electrode 42 may be separate from the source and drain electrodes 40S and 40D. In FIG. 1, a horizontal width of the gate insulating layer 40 may be the same as or greater than respective widths of the source and drain electrodes 40S and 40D. However, the horizontal width of the gate insulating layer 40 may be less than those of the source and drain electrodes 40S and 40D. In FIG. 1, the gate insulating layer 40 may protrude outside a boundary of the source and drain electrodes 40S and 40D in a horizontal direction. A horizontal width of the gate electrode 42 may be the same as or less than the horizontal width of the gate insulating layer 40. The source and drain electrodes 40S and 40D may have identical or different shapes and sizes. A first channel material layer 34 and a second channel material layer 38 are between the source and drain electrodes 40S and 40D. The first and second channel material layers 34 and 38 may be arranged in a direction perpendicular to the gate electrode 42. The first and second channel material layers 34 and 38 may be 2D material layers. The term "2D material" may include a two-dimensional (2D) material in the technical field of the described electronic device. The 2D material may be, for example, graphene, transition metal dichalcogenide (TMD), or molybdenite. The first and second channel material layers 34 and 38 are arranged in a vertical direction in FIG. 1. The first and second channel material layers 34 and 38 may overlap the gate insulating layer 40 and the gate electrode 42. However, the gate electrode 42 does not contact the first and second channel material layers 34 and 38. The first and second channel material layers 34 and 38 may partially overlap each other. However, the first and second channel material layers 34 and 38 do not directly contact each other. The first channel material layer 34 may contact the drain electrode 40D. Also, the second channel material layer 38 may contact the source electrode 40S. The first and second channel material layers 34 and 38 may be parallel to each other. An energy barrier forming layer 36 may be provided at an area where the first and second channel material layers 34 and 38 partially overlap each other. The energy barrier forming layer 36 may be a layer that forms an energy barrier between the first channel material layer 34 and the second channel material layer 38. The energy barrier forming layer 36 may prevent current from flowing through the first and second channel material layers 34 and 38 when the electronic device of FIG. 1 is turned off. The energy barrier forming layer 36 may be a semiconductor layer or an insulating layer that has an energy barrier that may block movement of carriers (for example, electrons or holes) with respect to the first and second channel material layers 34 and 38 when the electronic device of FIG. 1 is turned off. The energy barrier forming layer 36 may include, for example, a silicon (Si) layer, a germanium (Ge) layer, a compound semiconductor layer, a 2D semiconductor material layer, a 2D insulating layer, or various types of semiconductor thin films or function layers. For example, the compound semiconductor layer may be a group III-V compound semiconductor layer, and the function layer may be a material layer with a memory function.

For convenience of description, a horizontal width of the energy barrier forming layer 36 is less than the respective horizontal widths of the first and second channel material layers 34 and 38 in FIG. 1. The horizontal width of the energy barrier forming layer 36 may be the same as the respective horizontal widths of the first and second channel material layers 34 and 38. The horizontal width of the energy barrier forming layer 36 may be different from the respective horizontal widths of the first and second channel material layers 34 and 38, within a range in which the energy barrier forming layer 36 does not directly contact the first and second channel material layers 34 and 38. A portion of the energy barrier forming layer 36 protrudes outside the first channel material layer 34 in a vertical direction (i.e., in a direction from the drain electrode 40D to the source electrode 40S). The entire energy barrier forming layer 36 may overlap the gate electrode 42. That is, the entire energy barrier forming layer 36 may be located in an area of the gate electrode 42.

Figure 2:
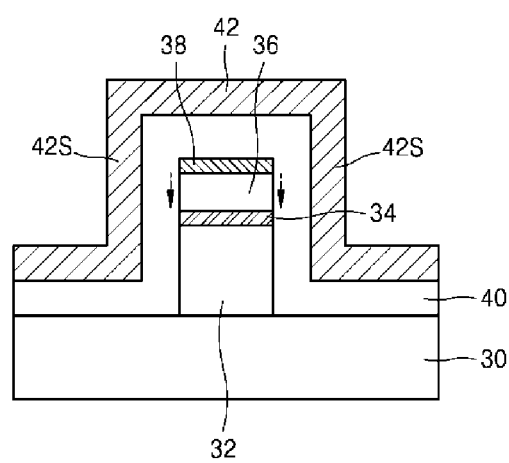

FIG. 2 is a cross-sectional view of the electronic device that is cut along a line 2-2' of FIG. 1.

Referring to FIG. 2, an insulating layer 32 is formed on a substrate 30. The substrate 30 may be used as a back gate electrode if necessary. The substrate 30 may be a semiconductor substrate or an electrode material substrate that is prepared for the purpose above. The insulating layer 32 may be on a portion of the substrate 30. The first channel material layer 34, the energy barrier forming layer 36, the second channel material layer 38 are sequentially stacked on the insulating layer 32. The insulating layer 32 may be thicker than the first channel material layer 34, the energy barrier forming layer 36, and the second channel material layer 38. A thickness of the energy barrier forming layer 36 may be the same as or different from respective thicknesses of the first and second channel material layers 34 and 38. For example, the energy barrier forming layer 36 may be thicker than the first channel material layer 34 or the second channel material layer 38. The thickness of the energy barrier forming layer 36 may be, for example, about 1 nm to hundreds of nm. The energy barrier forming layer 36 may be a tunneling layer. The insulating layer 32 may be a material layer that is appropriate for growing or transfer printing a 2D material. The substrate 30 and the insulating layer 32 may be referred to as 'substrate.' Hereinafter, the insulating layer 32, the first channel material layer 34, the energy barrier forming layer 36, and the second channel material layer 38 are referred to as 'first stack' for convenience of description. A (horizontal) width of the first stack may be, for example, tens of nm to hundreds of μm. The first channel material layer 34 may be a lower channel material layer, and the second channel material layer 38 may be an upper channel material layer. The gate insulating layer 40, which covers the first stack, is formed on the substrate 30. The gate insulating layer 40 may directly contact the first stack. The gate insulating layer 40 may cover an upper surface of the substrate 30, and a side surface and an upper surface of the first stack. The gate insulating layer 40 may be an insulative 2D material layer. The gate electrode 42 is formed on the gate insulating layer 40. The gate electrode 42 may be a conductive electrode. The gate electrode 42 may be a conductive 2D material layer. The gate electrode 42 may cover both side surfaces and the upper surface of the first stack. The gate electrode 42 includes a side gate electrode portion 42S that covers the both sides of the first stack. The side gate electrode portion 42S may completely cover (or face) side surfaces of the first and second channel material layers 34 and 38 and the energy barrier forming layer 36 of the first stack. The side gate electrode portion 42S may partially or completely cover a side surface of the insulating layer 32.

The side gate electrode portion 42S completely covers the side surface of the insulating layer 32, when the side gate electrode portion 42S contacts the substrate 30. Since the substrate 30 may be used as a bottom gate, when the side gate electrode portion 42S contacts the substrate 30, an entire circumference of the first stack, i.e., the upper surface, the both side surfaces, and a lower surface of the first stack is surrounded by the gate materials 30 and 42.

In addition, the gate electrode 42 and the first stack do not directly contact each other because of the gate insulating layer 40 between the first stack and the gate electrode 42. Due to the existence of the side gate electrode portion 42S of the gate electrode 42, when an operation voltage is applied to the gate electrode 42, a work function of a channel material layer, for example, the second channel material layer 38, changes, and simultaneously, the energy barrier forming layer 36 may be directly affected by an electric field effect. Accordingly, an operation voltage of the electronic device may decrease. The energy barrier forming layer 36 may be, but is not limited to, a single layer.

Figure 3:
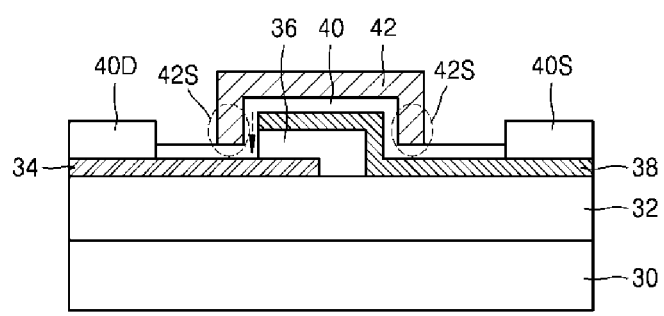

FIG. 3 is a cross-sectional view of the electronic device that is cut along a line 3-3' of FIG. 1.

Referring to FIG. 3, the insulating layer 32 is on the substrate 30. The first channel material layer 34 is on a portion of the insulating layer 32. The second channel material layer 38 is on another portion of the insulating layer 32. The first channel material layer 34 is separate from the second channel material layer 38. The energy barrier forming layer 36 is on a portion of the insulating layer 32 between the first and second channel material layers 34 and 38. The energy barrier forming layer 36 may directly contact the first and second channel material layers 34 and 38. The energy barrier forming layer 36 extends on a portion of the first channel material layer 34. The second channel material layer 38 covers a right side surface of the energy barrier forming layer 36 and extends to an upper surface of the energy barrier forming layer 36. The second channel material layer 38 may cover the entire upper surface of the energy barrier forming layer 36. The second channel material layer 38 may directly contact the upper surface and the right side surface of the energy barrier forming layer 36. Due to the thickness of the energy barrier forming layer 36, a step is created between an area where the second channel material layer 38 contacts the insulating layer 32 and an area where the second channel material layer 38 contacts the upper surface of the energy barrier forming layer 36. The first channel material layer 34 and the second channel material layer 38 may partially overlap each other with the energy barrier forming layer 36 therebetween. A horizontal gap (distance) between the first and second channel material layers 34 and 38 may be greater than a vertical gap (distance) between the first and second channel material layers 34 and 38. The drain electrode 40D is on the first channel material layer 34. The drain electrode 40D may directly contact the first channel material layer 34. The drain electrode 40D is separate from the energy barrier forming layer 36 and the second channel material layer 38. The source electrode 40S is on the second channel material layer 38. The source electrode 40S may directly contact the second channel material layer 38. The gate insulating layer 40 is between the drain and source electrodes 40D and 40S. The gate insulating layer 40 completely covers exposed portions of the first and second channel material layers 34 and 38 between the source and drain electrodes 40S and 40D, and an exposed side surface of the energy barrier forming layer 36 between the first and second channel material layers 34 and 38. The gate insulating layer 40 has a step that corresponds to a step of the second channel material layer 38. The gate insulating layer 40 surrounds the step of the second channel material layer 38. The gate electrode 42 is formed on the gate insulating layer 40. The gate electrode 42 covers the step of the second channel material layer 38 in the form of a cap. Accordingly, a portion of the first channel material layer 34, an entire area of the step of the second channel material layer 38, a flat portion of the second channel material layer 38 on the insulating layer 32, and an entire area of the energy barrier forming layer 36 are under the gate electrode 42. The side gate electrode portion 42S of the gate electrode 42 faces a side surface of the energy barrier forming layer 36 and a side surface of the step of the second channel material layer 38. Accordingly, when an operation voltage is applied to the gate electrode 42, an electric field may be directly applied to the energy barrier forming layer 36, and a field effect may occur directly on the energy barrier forming layer 36.

As described with reference to FIG. 2, the substrate 30 may also be used as a back gate electrode in FIG. 3. In this case, the first stack may have a structure surrounded by top and bottom gate electrodes (i.e., the gate electrode 42 and the substrate 30), that is, a 'gate all around' structure. Such structure may be more effective in controlling the electronic device than a structure of the related art which includes only a top gate or a back gate.

FIGS. 4A, 4B, 4C, and 5 illustrate operations of an electronic device according to some embodiments, based on changes of an energy band of the first band.

Figure 4A:
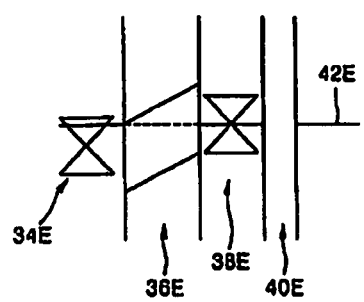
FIGS. 4A, 4B, 4C and 5 illustrate operations of an electronic device according to some embodiments, based on changes of an energy band of a stack that includes a channel material and an energy barrier forming layer.
Figure 4B:
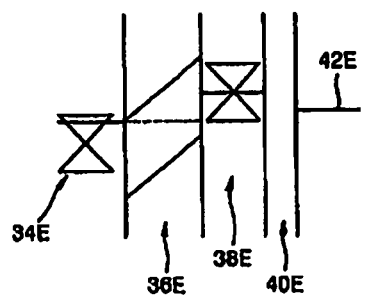
Figure 4C:
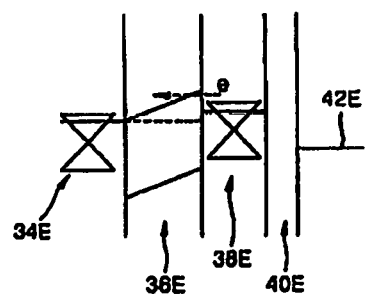

FIGS. 4A, 4B, and 4C show changes of an energy band of the first stack which are caused by a portion formed above the energy barrier forming layer 36 of the gate electrode 42 (hereinafter, 'top portion') when the electronic device according to some embodiments operates. Also, FIG. 5 shows changes of the energy band of the first stack when the top portion of the gate electrode 42 and the side gate electrode portion 42S are both provided.

Figure 5:
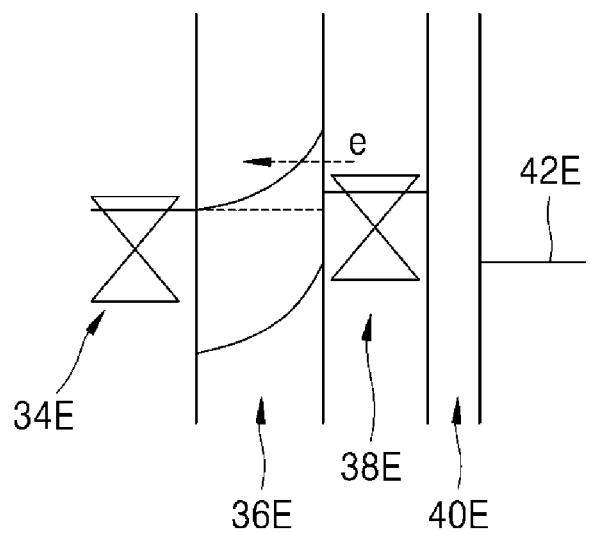

In FIGS. 4A-C and 5, a reference numeral '34E' indicates an energy band of the first channel material layer 34, '38E' indicates an energy band of the second channel material layer 38, and '36E' indicates an energy band of the energy barrier forming layer 36. Also, in FIGS. 4 and 5, '40E' indicates an energy band of the gate insulating layer 40, and '42E' indicates an energy band of the gate electrode 42. In FIGS. 4 and 5, the first and second channel material layers 34 and 38 are regarded as graphene layers.

FIG. 4A illustrates the energy band of the first stack when a voltage is not applied to the electronic device according to some embodiments.

Referring to FIG. 4A, an energy barrier exists between the energy barrier forming layer 36 and the second channel material layer 38.

FIG. 4B illustrates the energy band of the first stack when a reverse bias is applied between the first and second channel material layers 34 and 38 in the electronic device according to some embodiments.

Referring to FIG. 4B, an energy barrier, which is too high for current to flow, exists between the energy barrier forming layer 36 and the second channel material layer 38. Accordingly, current does not flow in the electronic device, that is, the electronic device is turned off.

FIG. 4C illustrates the energy band of the first stack when a voltage (for example, a + voltage if the electronic device is an n-type semiconductor device) is applied to the gate electrode 42 such that a forward bias is applied between the first and second channel material layers 34 and 38 in the electronic device according to some embodiments.

Referring to FIG. 4C, an energy barrier between the energy barrier forming layer 36 and the second channel material layer 38 is lower than the energy barriers of FIGS. 4A and 4B. This result is because a work function of the second channel material layer 38 is adjusted by applying the voltage to the gate electrode 42. Since the energy barrier between the energy barrier forming layer 36 and the second channel material layer 38 is lowered, as shown in FIG. 4C, by adjusting the work function of the second channel material layer 38, electrons e may flow between the first and second channel material layers 34 and 38. The electrons e may flow based on the thermionic emission principle or tunneling.

When the side gate electrode portion 42S of the gate electrode 42 is added to the embodiments shown in FIGS. 4A to 4B, the side gate electrode portion 42S may cause a field effect to directly occur on the energy barrier forming layer 36 without using a channel material layer. In other words, when the side gate electrode portion 42S is added to the embodiments shown in FIGS. 4A to 4B and a forward voltage is applied to the gate electrode 42, as shown in FIG. 5, the energy band 36E of the energy barrier forming layer 36 may increase and bend from the first channel material layer 34 to the second channel material layer 38. Accordingly, a tunneling thickness of an energy barrier, through which electrons have to pass, between the energy barrier forming layer 36 and the second channel material layer 38 is less than that in the embodiment of FIG. 4C. Therefore, tunneling of the electrons may occur in a lower voltage than the embodiment of FIG. 4C.

This result implies that by adding the side gate electrode portion 42S to the embodiments shown in FIGS. 4A to 4B, the electron device may be turned on at an operation voltage that is lower than an operation voltage of when the side gate electrode portion 42S is not included.

Since the operation voltage of the electronic device according to some embodiments is lowered by including the side gate electrode portion 42S, a sub-threshold swing (SS) value of the electronic device may be less than that of an electronic device without the side gate electrode portion 42S, that is, an electronic device including only a top gate or a bottom gate.

Due to the side gate electrode portion 42S, when a forward voltage is applied to the gate electrode 42, the energy band 36E of the energy barrier forming layer 36 may bend as shown in FIG. 5, and current (hereinafter, referred to as 'side current' for convenience) may flow through a passage (for example, an interface of the energy barrier forming layer 36) that connects an end (edge) of the first channel material layer 34 and an end (edge) of the second channel material layer 38.

Dashed arrows between the first and second channel material layers 34 and 38 in FIGS. 2 and 3 indicate the above-described side current.

According to a result of recent research (for example, IEEE Electron Device Letters (EDL), Vol. 34, No. 9), an electron device may be operated by using the side current. Also, even according to theoretical calculations, a device with the side current may show more excellent properties than a device without the side current (refer to Scientific Reports, 4:6607).

Based on the description above, the side current may be used in the above-described electronic device and an electronic device to be described below. Thus, properties of the operation of the electronic device may be more improved.

A method of manufacturing an electronic device, according to some embodiments, will be described with reference to FIGS. 6 to 12. Elements that are the same those described above are denoted with like reference numerals.

FIGS. 6A, 7A, 8A, 9A, 10A, 11A, and 12A are plan views, and FIGS. 6B and 6C, 7B and 7C, 8B and 8C, 9B and 9C, 10B and 10C, 11B and 11C, and 12B and 12C are cross-sectional views of FIGS. 6A, 7A, 8A, 9A, 10A, 11A, and 12A, respectively, that are cut in different directions.

Figure 6A:
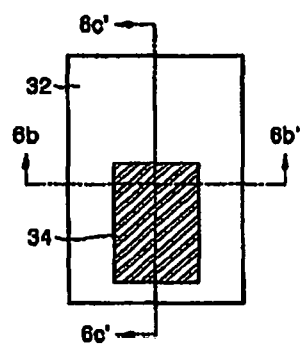
FIGS. 6A, 6B, 6C, 7A, 7B, 7C, 8A, 8B, 8C, 9A, 9B, 9C, 10A, 10B, 10C, 11A, 11B, 11C, 12A, 12B, and 12C are plan views and cross-sectional views of a method of manufacturing an electronic device that includes a side gate and a 2D material, according to some embodiments.
Figure 6B:
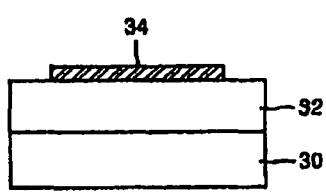
Figure 6C:
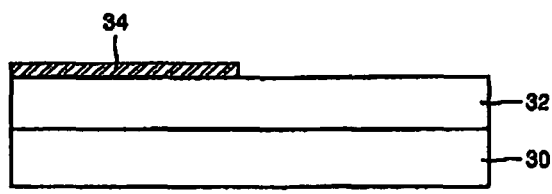

Referring to FIGS. 6A to 6C, the insulating layer 32 is formed on the substrate 30. The insulating layer 32 may be formed with a material appropriate for forming a 2D material layer. For example, the insulating layer 32 may be an h-BN layer for directly growing graphene. The first channel material layer 34 is formed on the insulating layer 32. The first channel material layer 34 may be formed on a portion of the insulating layer 32. The first channel material layer 34 may be formed by using chemical vapor deposition, an e-beam evaporator, or a sputter. The first channel material layer 34 may be formed by using a 2D material. When the 2D material is graphene, graphene may be grown directly on the insulating layer 32 or graphene formed on another substrate may be transferred and printed onto the insulating layer 32.

Figure 7A:
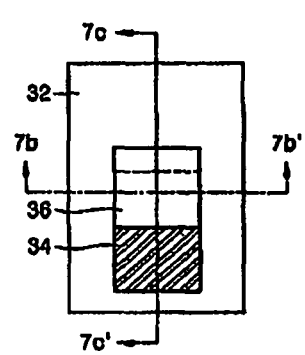
Figure 7B:
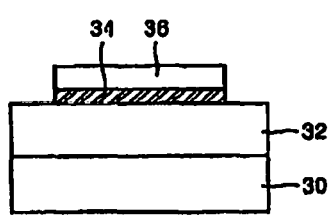
Figure 7C:
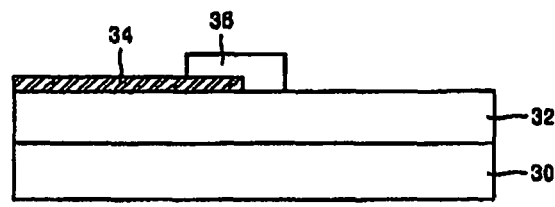

Referring to FIGS. 7A to 7C, the energy barrier forming layer 36 is formed on a portion of the insulating layer 32. The energy barrier forming layer 36 is formed such that a portion of the energy barrier forming layer 36 overlaps a portion of the first channel material layer 34. An end of the first channel material layer 34 may overlap a portion of the energy barrier forming layer 36 in a longitudinal direction of the first channel material layer 34. Accordingly, the portion of the energy barrier forming layer 36 directly contacts the first channel material layer 34. The energy barrier forming layer 36 may be a single layer or multiple layers. The energy barrier forming layer 36 may include a plurality of layers.

Figure 8A:
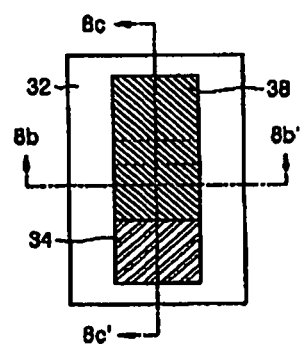
Figure 8B:
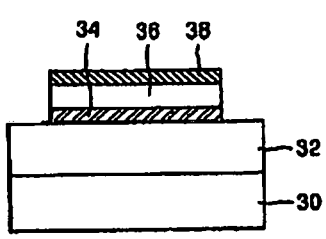
Figure 8C:
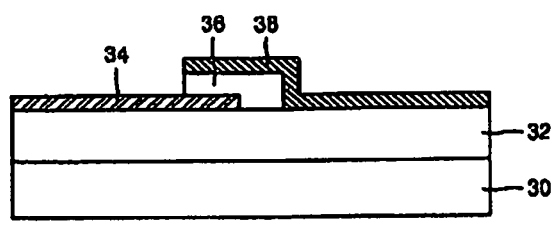

Referring to FIGS. 8A to 8C, the second channel material layer 38, which overlaps the energy barrier forming layer 36 and the first channel material layer 34, is formed on the insulating layer 32. A portion of the second channel material layer 38 overlaps a portion of the first channel material layer 34. However, since the energy barrier forming layer 36 is formed between the first and second channel material layers 34 and 38, the first and second channel material layers 34 and 38 do not directly contact each other. The second channel material layer 38 may completely overlap the energy barrier forming layer 36. The second channel material layer 38 and the energy barrier forming layer 36 may directly contact each other. The second channel material layer 38 may be formed in parallel to the first channel material layer 34 on the insulating layer 32. The second channel material layer 38 is formed such that a side surface of the energy barrier forming layer 36, which is adjacent to the second channel material layer 38, and an upper surface of the energy barrier forming layer 36 are covered. Due to the thickness of the energy barrier forming layer 36, a step is created between the insulating layer 32 and the energy barrier forming layer 36. Therefore, the second channel material layer 38, which covers the energy barrier forming layer 36, has a step that corresponds to the step between the insulating layer 32 and the energy barrier forming layer 36. As shown in FIG. 8B, since the first channel material layer 34, the energy barrier forming layer 36, and the second channel material layer 38 overlap each other, a stack may be formed in the overlapping areas.

Figure 9A:
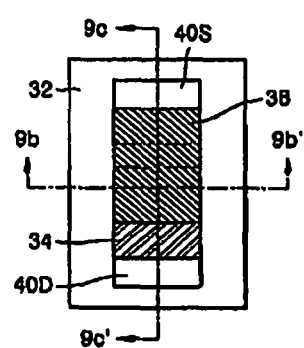
Figure 9B:
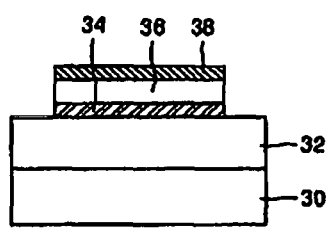
Figure 9C:
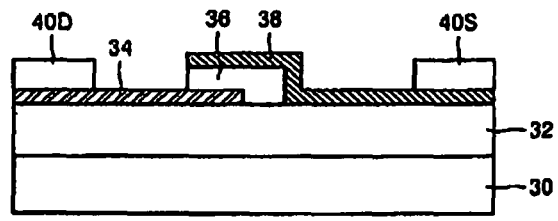
Figure 10A:
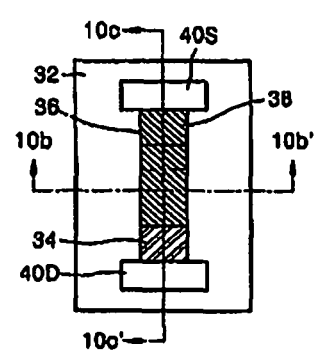
Figure 10B:
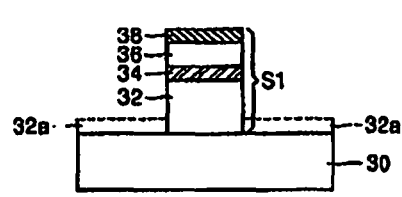
Figure 10C:
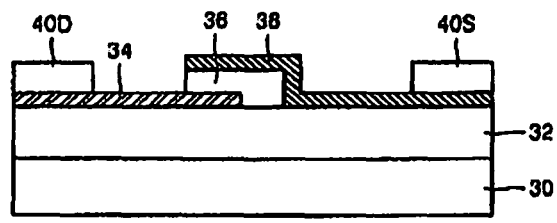

Referring to FIGS. 9A to 9C, the drain electrode 40D is formed on the first channel material layer 34 and the source electrode 40S is formed on the second channel material layer 38. The drain and source electrodes 40D and 40S may be formed by using a photolithography process. The photolithography process may be known well in semiconductor manufacturing. The drain and source electrodes 40D and 40S are spaced apart from the energy barrier forming layer 36. The drain and source electrodes 40D and 40S may be formed alongside in a straight line. Next, in order to form a channel between the source and drain electrodes 40S and 40D, a patterning process for reducing respective horizontal widths of the first and second channel material layers 34 and 38 and the energy barrier forming layer 36 between the source and drain electrodes 40S and 40D is performed. Such patterning process is a photographic and etching method using a mask, and may include an etching process, which is performed when a portion that has to remain between the source and drain electrodes 40S and 40D is covered with a mask and other portions of the source and drain electrodes 40S and 40D are exposed, as shown in FIGS. 10A to 10C. The etching process may be performed until the substrate 30 is exposed. As a result, portions other than the portion covered with the mask are removed on the substrate 30. Also, as shown in FIGS. 10A to 10C, a first stack S1, which includes the insulating layer 32 and the first channel material layer 34, the energy barrier forming layer 36, and the second channel material layer 38 that are sequentially stacked on the insulating layer 32, is formed on the substrate 30. Due to the patterning process, respective horizontal widths of the first and second channel material layers 34 and 38 and the energy barrier forming layer 36 become less than the respective widths of the drain and source electrodes 40D and 40S, as shown in FIGS. 10A to 10C. An etching thickness of the insulating layer 32 may be adjusted in the etching process. For example, if the gate electrode 42 covers a side surface of the energy barrier forming layer 36 in following processes even if a portion of the insulating layer 32 is removed, the insulating layer 32 may not have to be completely etched. Accordingly, an insulating layer 32a that is thinner than the insulating layer 32 of the first stack S1 may be on a portion of the substrate 30 around the first stack S1, as shown in FIG. 10B.

Figure 11A:
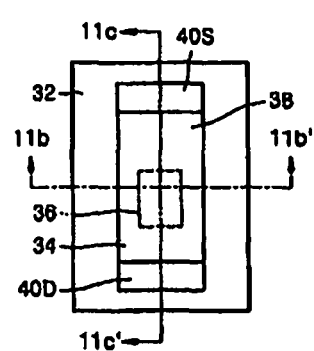
Figure 11B:
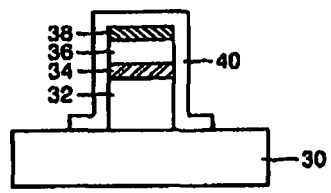
Figure 11C:
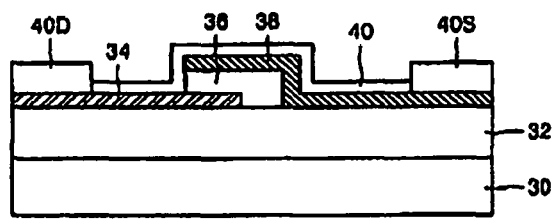

Referring to FIGS. 11A to 11C, the gate insulating layer 40, which covers the first stack S1, is formed on the substrate 30. A side surface and an upper surface of the first stack S1 may directly contact the gate insulating layer 40. The gate insulating layer 40 may cover a portion of the substrate 30 between the drain and source electrodes 40D and 40S.

In FIG. 11A, a horizontal width of the gate insulating layer 40 is the same as respective horizontal widths of the drain and source electrodes 40D and 40S. However, the horizontal width of the gate insulating layer 40 may be different from the respective horizontal widths of the drain and source electrodes 40D and 40S.

Figure 12A:
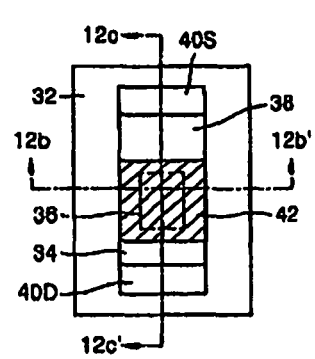
Figure 12B:
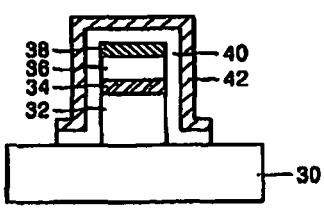
Figure 12C:
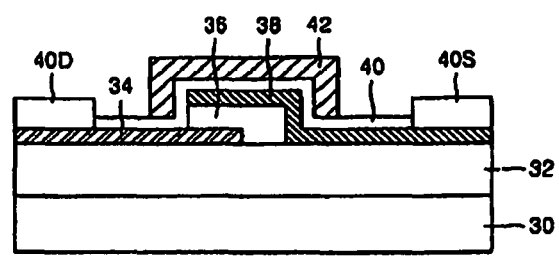

Referring to FIGS. 12A to 12C, the gate electrode 42 is formed on the gate insulating layer 40. The gate electrode 42 is spaced apart from the drain and source electrodes 40D and 40S. The gate electrode 42 is formed such that the first stack S1, including the first channel material layer 34, the energy barrier forming layer 36, and the second channel material layer 38, is covered. In a horizontal direction, the gate electrode 42 may cover respective side surfaces and upper surfaces of the first channel material layer 34, the energy barrier forming layer 36, and the second channel material layer 38, and a portion of a side surface of the insulating layer 32. A width of the gate electrode 42 may be the same as or different from a width of the gate insulating layer 40 in the horizontal direction. For example, the width of the gate electrode 42 may be less than the width of the gate insulating layer 40 in the horizontal direction.

Referring to FIG. 12C, in a vertical direction, the gate electrode 42 completely covers the energy barrier forming layer 36 and partially covers the first and second channel material layers 34 and 38. A portion of the gate electrode 42 faces a side surface of the energy barrier forming layer 36 that is not covered with the second channel material layer 38. Accordingly, the electronic device according to some embodiments is manufactured. The manufacturing process may further include a well-known process. Some steps in the manufacturing process may be performed by using other methods known in the manufacturing of electronic devices.

Electronic devices according to other exemplary embodiments described below include examples of modifying the first stack in various ways. Therefore, the electronic device described below may be manufactured based on the manufacturing method described with reference to FIGS. 6 to 12.

Hereinafter, an electronic device that includes a side gate and a 2D material will be described with reference to other exemplary embodiments. Elements that are the same those described above are denoted with like reference numerals.

Figure 13:
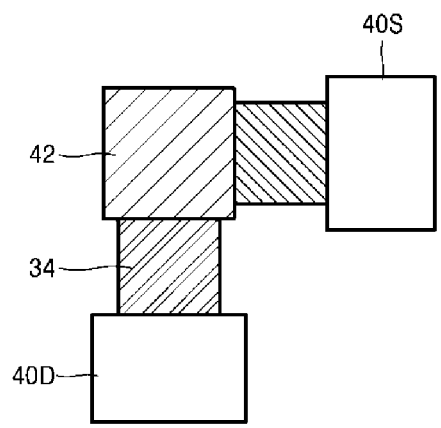
FIG. 13 is a plan view of an example of an electronic device according to some embodiments in which a source electrode and a drain electrode are not arranged in a straight line.

FIG. 13 is a plan view of an example of an electronic device according to some embodiments in which the source and drain electrodes 40S and 40D are not arranged in a straight line. For convenience, the gate insulating layer 40 is not illustrated in FIG. 13.

Referring to FIG. 13, the source and drain electrodes 40S and 40D may be perpendicular to each other. Specifically, the gate electrode 42, the second channel material layer 38, and the source electrode 40S are arranged in a first direction in a straight line. Also, the gate electrode 42, the first channel material layer 34, and the drain electrode 40D are arranged in a second direction in a straight line. The first and second directions may be perpendicular to each other. Alternatively, the first and second directions may form an acute angle or an obtuse angle.

Figure 14:
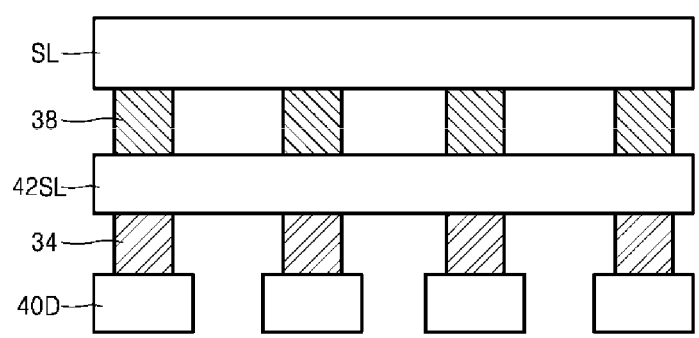
FIG. 14 is a plan view of an electronic device that includes a side gate and a 2D material, according to some embodiments.

FIG. 14 is a plan view of an electronic device that includes a side gate and a 2D material, according to some embodiments. For convenience, the gate insulating layer 40 is not illustrated in FIG. 14.

The electronic device of FIG. 14 has a structure in which one source electrode corresponds to a plurality of drain electrodes.

Referring to FIG. 14, a plurality of drain electrodes 40D are connected to a source electrode line SL. Although four drain electrodes 40D are connected to the source electrode line SL in FIG. 14 for convenience, more or less than four drain electrodes 40D may be connected thereto. A gate electrode line 42SL is provided between the source electrode line SL and the plurality of drain electrodes 40D. The gate electrode line 42SL is spaced apart from the source electrode line SL and the drain electrode 40D. The gate electrode line 42SL and the drain electrodes 40D may be divided into the same number of portions. Four second channel material layers 38 are disposed between the source electrode line SL and the gate electrode line 42SL. The four second channel material layers 38 and the four drain electrodes 40D correspond to one another. The number of second channel material layers 38 may be the same as the number of drain electrodes 40D. Four first channel material layers 34 are disposed between the gate electrode line 42SL and the drain electrode 40D. The four first channel material layers 34 and the four drain electrodes 40D correspond to one another. The number of first channel material layers 34 may be the same as the number of drain electrodes 40D.

Figure 15:
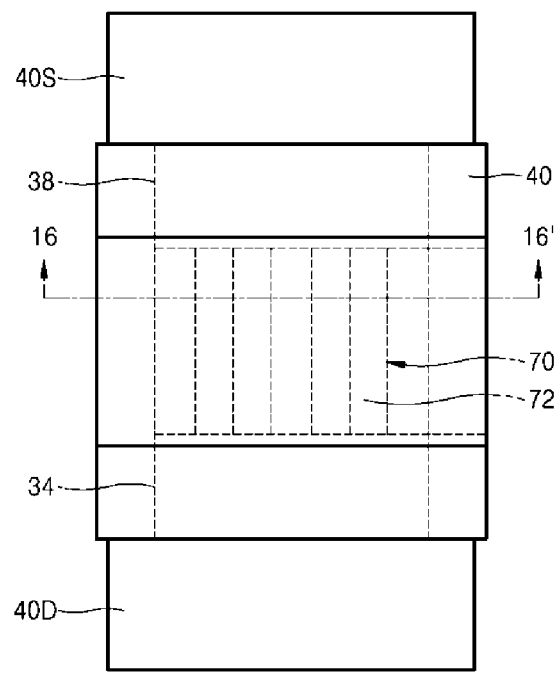
FIGS. 15, 16, and 17 are plan views and cross-sectional views of an electronic device that includes a side gate and a 2D material, in which a single device includes a plurality of channels, according to some embodiments.

FIG. 15 is a plan view of an electronic device that includes a side gate and a 2D material, according to some embodiments, in which a single device includes a plurality of channels.

Figure 16:
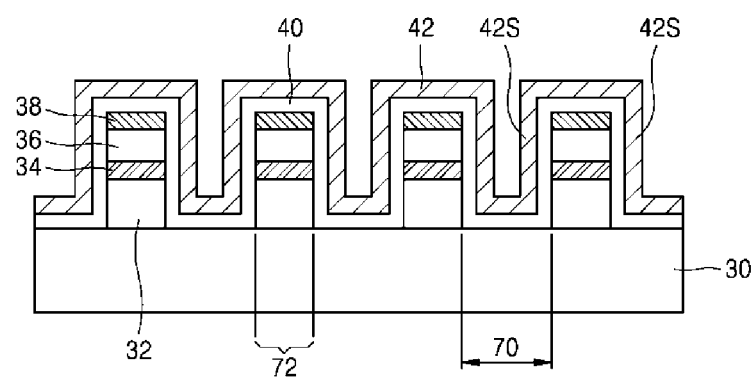

Referring to FIG. 15, a plurality of channels 72 are between the source electrode 40S and the drain electrode 40D. The first channel material layer 34, which connects the plurality of channels 72 to the drain electrode 40D, is between the plurality of channels 72 and the drain electrode 40D. Also, the second channel material layer 38, which connects the plurality of channels 72 to the source electrode 40S, is between the plurality of channels 72 and the source electrode 40S. The plurality of channels 72 and the first and second channel material layers 34 and 38 are all under the gate insulating layer 40. The plurality of channels 72 are under the gate electrode 42. A through hole 70 is between the plurality of channels 72. One side of each of the plurality of channels 72 is connected to the first channel material layer 34, and another side of each of the plurality of channels 72 is connected to the second channel material layer 38. The first channel material layer 34 is divided into a plurality under the gate insulating layer 40 that is under the gate electrode 42. The second channel material layer 38 is also divided into a plurality under the gate insulating layer 40 that is under the gate electrode 42. The first and second channel material layers 34 and 38, which are divided into a plurality, are stacked one by one, and the energy barrier forming layer 36 is provided between the first and second channel material layers 34 and 38, as shown in FIG. 16. Thus, the plurality of channels 72 are formed.

FIG. 16 is a cross-sectional view of the electronic device that is cut along a line 16-16' of FIG. 15.

Referring to FIG. 16, four insulating layers 32 are formed and separate from each other on the substrate 30. On each of the insulating layers 32, the first channel material layer 34, the energy barrier forming layer 36, and the second channel material layer 38 are sequentially stacked. The first channel material layer 34 on each of the insulating layers 32 is one portion of the first channel material layer 34 between the plurality of channels 72 and the drain electrode 40D which is divided into a plurality in FIG. 15. Although the first channel material layer 34 is divided by four in FIGS. 15 and 16 for convenience, alternatively, the first channel material layer 34 may be divided by more or less than four. The second channel material layer 38 on each of the insulating layers 32 is one portion of the second channel material layer 38 between the plurality of channels 72 and the source electrode 40S which is divided into a plurality in FIG. 15. Although the second channel material layer 38 is divided by four in FIGS. 15 and 16 for convenience, alternatively, the second channel material layer 38 may be divided by more or less than four.

In FIG. 15, the first and second channel material layers 34 and 38 may be divided by an identical number, under the gate electrode 42. When the insulating layer 32 and a stack (that is, the first channel material layer 34, the energy barrier forming layer 36, and the second channel material layer 38) on the insulating layer 32 are referred to as ' gate stack', four separate gate stacks are on the substrate 30. The gate insulating layer 40 and the gate electrode 42, which cover the four gate stacks, are sequentially stacked on the substrate 30. The gate insulating layer 40 may cover and directly contact side surfaces and upper surfaces of the four gate stacks. The gate electrode 42 may also cover the side surfaces and upper surfaces of the four gate stacks. The gate electrode 42 completely covers side surfaces of the first and second channel material layers 34 and 38 and side surfaces of the energy barrier forming layer 36, but partially covers side surfaces of the insulating layer 32. The gate electrode 42 does not directly contact the four gate stacks because of the gate insulating layer 40. The four gate stacks are the plurality of channels 72. The gate insulating layer 40 and the gate electrode 42 are in the through hole 70 between the plurality of channels 72. Other spaces in the through hole 70 may be filled with the gate electrode 42.

As shown in FIGS. 15 and 16, by providing the plurality of channels 72 on the substrate 30 of the electronic device, side surfaces of the side gate electrode portion 42S and the side surfaces of the energy barrier forming layer 36 are bigger than those when only one channel is provided. Accordingly, the side gate electrode portion 42S and the energy barrier forming layer 36 face each other with a greater area than when there is only one channel. Therefore, a field effect that directly affects the energy barrier forming layer 36 via the side gate electrode portion 42S may significantly increase, compared to when there is only one channel. Thus, an operation voltage and an SS value of the electronic device may be lower than when there is only one channel.

Figure 17:
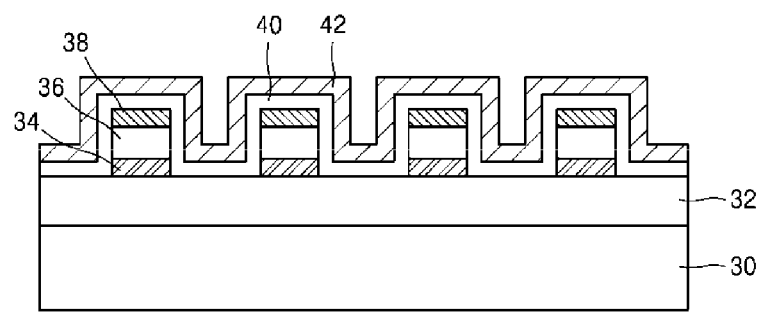

FIG. 17 is a modified example of FIG. 16.

Referring to FIG. 17, the insulating layer 32 is on an entire upper surface of the substrate 30. Four separate gate stacks are on the insulating layer 32. The gate stacks of FIG. 17 are different from the gate stacks of FIG. 16. Each of the four gate stacks of FIG. 17 does not include the insulating layer 32. Each of the four gate stacks of FIG. 17 includes the first channel material layer 34, the energy the barrier forming layer 36, and the second channel material layer 38 that are sequentially stacked. The gate stacks are covered with the gate insulating layer 40. The gate insulating layer 40 completely covers side surfaces and an upper surface of the gate stacks. The gate electrode 42 is formed on the gate insulating layer 40. The gate electrode 42 is formed along a surface of the gate insulating layer 40. The gate electrode 42 may also cover the side surfaces and the upper surface of the gate stack. Although the gate electrode 42 may cover the side surfaces of the energy barrier forming layer 36 and the side surfaces of the second channel material layer 38, the gate electrode 42 may not be able to cover the side surfaces of the first channel material layer 34 because of the gate insulating layer 40.

Figure 18:
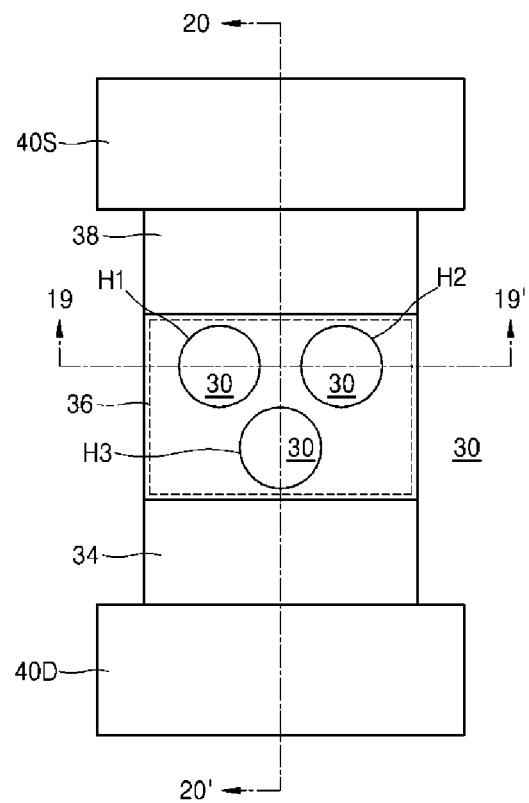
FIGS. 18, 19, and 20 are a plan view and cross-sectional views of an electronic device according to some embodiments, in which a plurality of holes are formed in a channel.

FIG. 18 is a plan view of an electronic device according to some embodiments, in which a plurality of holes are formed in a channel. In FIG. 18, the gate insulating layer 40 and the gate electrode 42 are not yet formed.

Referring to FIG. 18, the first and second channel material layers 34 and 38 are between the source and drain electrodes 40S and 40D. The first channel material layer 34 is connected to the drain electrode 40D, and the second channel material layer 38 is connected to the source electrode 40S. The first and second channel material layers 34 and 38 partially overlap each other. First to third through holes H1 to H3 are formed in an overlapping portion of the first and second channel material layers 34 and 38. Portions of the substrate 30 are exposed through the first to third through holes H1 to H3. The first to third through holes H1 to H3 separate from each other. The first to third through holes H1 to H3 may be shaped as circles. Respective shapes and an arrangement of the first to third through holes H1 to H3 may be random. However, if a side gate electrode of a gate electrode faces a large area of a side surface of the energy barrier forming layer 36, the first to third through holes H1 to H3 may be arranged in a certain manner, or have a certain shape or various shapes (for example, circles or quadrilaterals). In FIG. 18, a horizontal width of the energy barrier forming layer 36 is less than respective horizontal widths of the first and second channel material layers 34 and 38 so that the energy barrier forming layer 36 in the overlapping portion of the first and second channel material layers 34 and 38 is easily recognized. The horizontal width of the energy barrier forming layer 36 may be the same as the respective horizontal widths of the first and second channel material layers 34 and 38.

Figure 19:
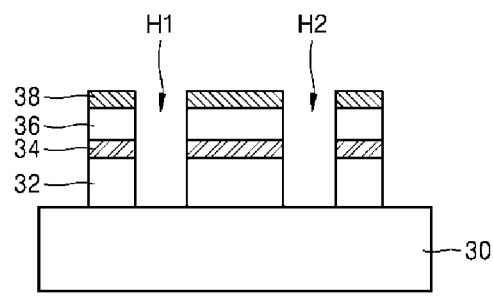

FIG. 19 is a cross-sectional view of the electronic device that is cut along a line 19-19' of FIG. 18.

Referring to FIG. 19, the insulating layer 32, the first channel material layer 34, the energy barrier forming layer 36, and the second channel material layer 38 are sequentially stacked on the substrate 30, thereby forming a stack. The first and second through holes H1 and H2, through which the substrate 30 is exposed, are formed between the stacks. Respective side surfaces of the first and second channel material layers 34 and 38 and a side surface of the energy barrier forming layer 36 are exposed via the first and second through holes H1 and H2.

Figure 20:
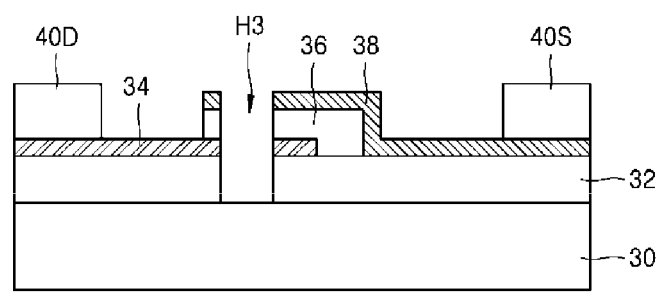

FIG. 20 is a cross-sectional view of the electronic device that is cut along a line 20-20' of FIG. 18.

Referring to FIG. 20, the insulating layer 32 is formed on the substrate 30. The first and second channel material layers 34 and 38 are formed on the insulating layer 32. The first and second channel material layers 34 and 38 are horizontally separate from each other and do not contact each other. The first and second channel material layers 34 and 38 may partially overlap each other but not contact each other. In an area where the first and second channel material layers 34 and 38 overlap each other, the energy barrier forming layer 36 is between the first and second channel material layers 34 and 38. The energy barrier forming layer 36 contacts a portion of the substrate 30 between the first and second channel material layers 34 and 38. In other words, the energy barrier forming layer 36 is provided on the substrate 30 between the first and second channel material layers 34 and 38 and extends onto a portion of the first channel material layer 34. An upper surface and a right side surface of the energy barrier forming layer 36 is covered by a portion of the second channel material layer 38. The third through hole H3 is formed by removing a portion of an area where the first channel material layer 34, the energy barrier forming layer 36, and the second channel material layer 38 overlap each other. The substrate 30 is exposed via the third through hole H3. The respective side surfaces of the first and second channel material layers 34 and 38 and the side surface of the energy barrier forming layer 36 are exposed via the third through hole H3. The drain electrode 40D is on the first channel material layer 34, and the source electrode 40S is on the second channel material layer 38. Between the source and drain electrodes 40S and 40D, the third through hole H3 and the area where the first and second channel material layers 34 and 38 and the energy barrier forming layer 36 overlap each other and are located.

As shown in FIGS. 19 and 20, the first to third through holes H1 to H3 are in the area where the first and second channel material layers 34 and 38 and the energy barrier forming layer 36 overlap each other, and the side surfaces of the energy barrier forming layer 36 are exposed via the first to third through holes H1 to H3. Therefore, compared to an example in which the first to third through holes H1 to H3 are not formed, a relatively larger area of the side surfaces of the energy barrier forming layer 36 is exposed. Accordingly, a greater area of the side surfaces of the energy barrier forming layer 36 may face the side gate electrode portion of the gate electrode, and an operation voltage and an SS value of the electronic device may decrease.

Figure 21:
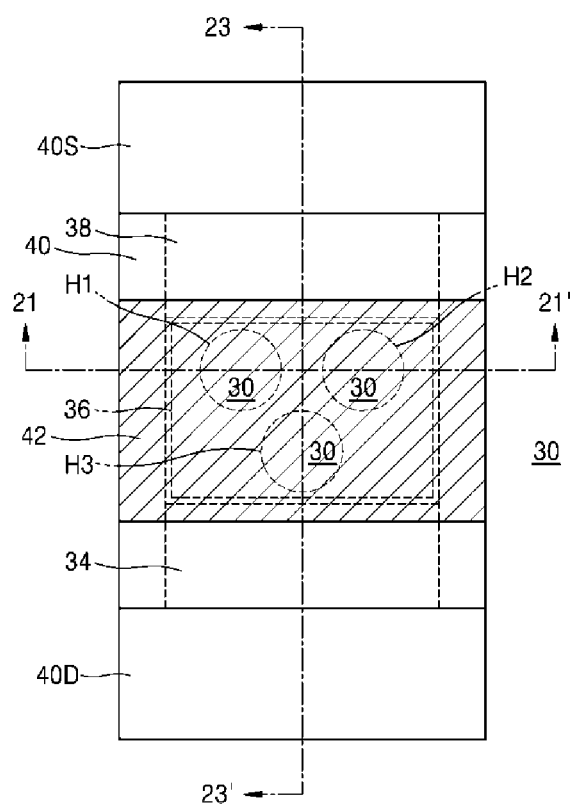
FIGS. 21, 22, and 23 are a plan view and cross-sectional views of an example in which a gate insulating layer and a gate electrode are provided in the electronic device of FIG. 18.

FIG. 21 illustrates the electronic device of FIG. 18 in which the gate insulating layer 40 covers the first and second channel material layers 34 and 38 and the energy barrier forming layer 36 between the source and drain electrodes 40S and 40D, and the gate electrode 42 is provided on the gate insulating layer 40.

Referring to FIG. 21, an area where the first and second channel material layers 34 and 38 overlap each other is covered with the gate electrode 42. Accordingly, the first to third through holes H1 to H3 are also covered by the gate electrode 42.

Figure 22:
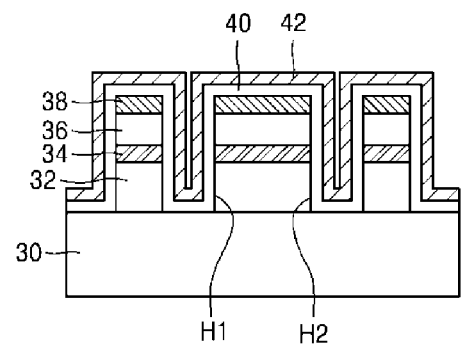

FIG. 22 is a cross-sectional view of the electronic device cut along a line 22-22' of FIG. 21.

Referring to FIG. 22, the gate insulating layer 40 covers an upper surface of the second channel material layer 38. Also, the gate insulating layer 40 covers all surfaces that are exposed via the first and second through holes H1 and H2, that is, side surfaces of the insulating layer 32, the first and second channel material layers 34 and 38, and the energy barrier forming layer 36, and the substrate 30. The gate electrode 42 is formed along a surface of the gate insulating layer 40. The gate electrode 42 covers an upper surface of the channel material layer 38. Also, the gate electrode 42 covers respective side surfaces of the first and second channel material layers 34 and 38 and side surfaces of the energy barrier forming layer 36 which are exposed via the first and second through holes H1 and H2. The gate electrode 42 may also partially cover side surfaces of the insulating layer 32. However, the material layers that are covered by the gate electrode 42 do not directly contact the gate electrode 42.

Portions of the first and second through holes H1 and H2, which remain after the gate insulating layer 40 is formed, may be filled with the gate electrode 42. A portion of the gate electrode 42 formed in the first and second through holes H1 and H2 is a side gate electrode that faces the side surfaces of the energy barrier forming layer 36.

Figure 23:
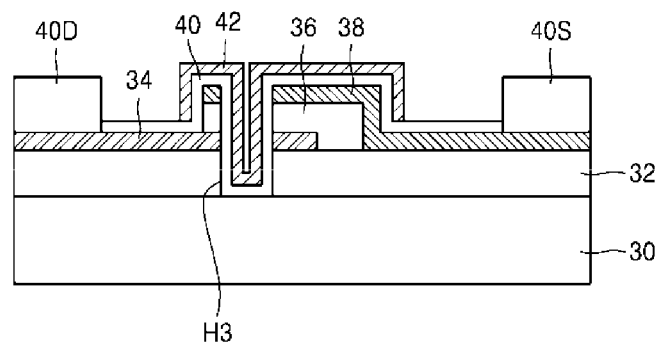

FIG. 23 is a cross-sectional view of the electronic device cut along a line 23-23' of FIG. 21.

FIG. 23 shows the electronic device of FIG. 20 that additionally includes the gate insulating layer 40 and the gate electrode 42. Only the additionally added elements will be described.

Referring to FIG. 23, the gate insulating layer 40 is between the source and drain electrodes 40S and 40D, and the gate electrode 42 is formed on the gate insulating layer 40. The gate electrode 42 covers an area where the first and second channel material layers 34 and 38 overlap each other, and the third through hole H3. The gate insulating layer 40 contacts the drain and source electrodes 40D and 40S. The gate insulating layer 40 may cover exposed portions of the first and second channel material layers 34 and 38, the energy barrier forming layer 36, and the substrate 30 between the source and drain electrodes 40S and 40D. The gate insulating layer 40 covers portions of an upper surface of the substrate 30, a side surface of the insulating layer 32, respective side surfaces of the first and second channel material layers 34 and 38, and side surfaces of the energy barrier forming layer 36, which are exposed via the third through hole H3. The gate electrode 42 is also provided in the third through hole H3. The gate electrode 42 may cover the portions of the side surfaces of the first and second channel material layers 34 and 38 and the side surfaces of the energy barrier forming layer 36, which are exposed via the third through hole H3, and a portion of the side surface of the insulating layer 32. A portion of the third through hole H3, which remains after the gate insulating layer 40 is provided in the third through hole H3, may be completely filled with the gate electrode 42.

Although FIGS. 22 and 23 illustrate that the first to third through holes H1 to H3 completely penetrate through the insulating layer 32, the first to third through holes H1 to H3 do not have to penetrate through the insulating layer 32.

For example, if the gate electrode 42 may completely cover the side surfaces of the energy barrier forming layer 36 in the first to third through holes H1 to H3, the first to third through holes H1 to H3 do not have to penetrate through the insulating layer 32, and may be formed by partially removing the insulating layer 32 during a process of forming the first to third through holes H1 to H3.

Figure 24A:
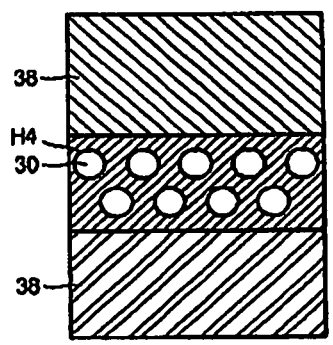
FIGS. 24A, 24B, and 24C are plan views of examples showing various arrangements of a plurality of holes of FIG. 18.
Figure 24B:
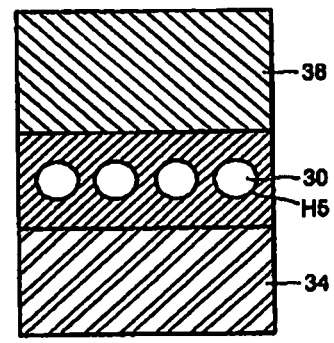
Figure 24C:
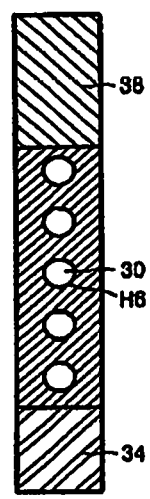

More or less through holes than the first to third through holes H1 to H3 may be in an overlapping area of the first and second channel material layers 34 and 38 in various arrangements. FIGS. 24A to 24C show examples of arranging the through holes. For convenience, only the first and second channel material layers 34 and 38 are illustrated in FIG. 24.

Referring to FIG. 24A, a plurality of fourth through holes H4 are formed in the overlapping area of the first and second channel material layers 34 and 38. The plurality of fourth through holes H4 are horizontally arranged in two rows. The plurality of fourth through holes H4 may be horizontally arranged in more than two rows. The plurality of fourth through holes H4 may also be vertically arranged in at least one column. That is, the plurality of fourth through holes H4 may form a matrix. The plurality of fourth through holes H4 may be shaped as circles as shown in FIG. 24, non-shaped as circles, or polygon-shaped. Some of the plurality of fourth through holes H4 may have shapes and sizes that are different from those of other plurality of fourth through holes H4.

As shown in FIG. 24B, only a plurality of fifth through holes H5 horizontally arranged in one row may be formed in an overlapping area of the first and second channel material layers 34 and 38. Alternatively, as shown in FIG. 24C, only a plurality of sixth through holes H6 vertically arranged in one column may be formed in the overlapping area of the first and second channel material layers 34 and 38. Shapes of the plurality of fifth and sixth through holes H5 and H6 may be similar to or the same as those of the plurality of fourth through holes H4. Sizes of the plurality of fifth and sixth through holes H5 and H6 may be greater than those of the plurality of fourth through holes H4.

Figure 25A:
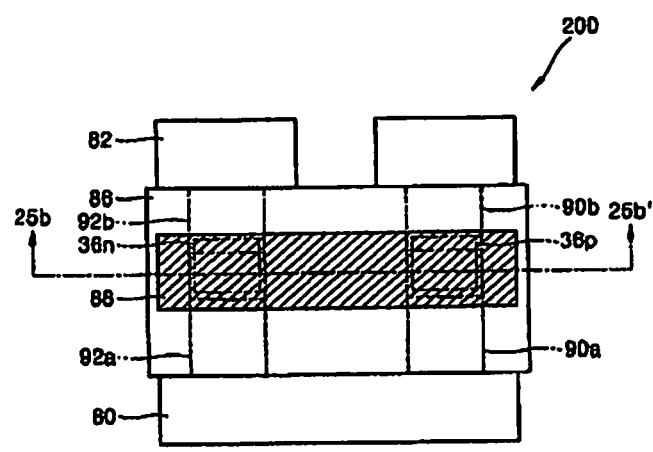
FIGS. 25A and 25B are a plan view and a cross-sectional view of an inverter including an electronic device according to some embodiments.
Figure 25B:
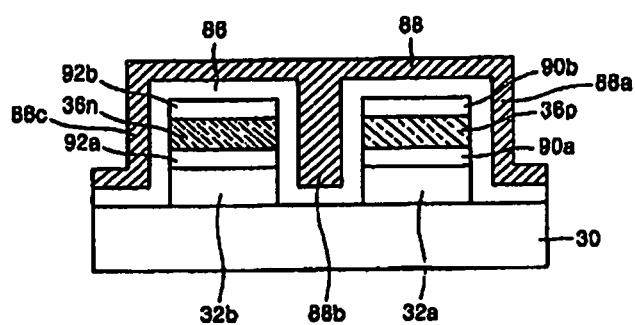

FIGS. 25A and 25B are a plan view and a cross-sectional view of an inverter 200 including an electronic device according to some embodiments. FIG. 25B is a cross-sectional view of the inverter 200 cut along a line 25b-25b' of FIG. 25A.

Referring to FIG. 25A, the inverter 200 includes a ground terminal 82, and a VDD terminal 84, and an output (Vout) terminal 80. Third and fourth channel material layers 90a and 90b are provided between the output terminal 80 and the VDD terminal 84. The third channel material layer 90a contacts the output terminal 80. The fourth channel material layer 90b contacts the VDD terminal 84. Portions of the third and fourth channel material layers 90a and 90b may overlap each other. Functions, materials, and arrangement of the third and fourth channel material layers 90a and 90b may be the same as those of the first and second channel material layers 34 and 38 described above. A p-type energy barrier forming layer 36p is provided in an area where the third and fourth channel material layers 90a and 90b overlap each other. The p-type energy barrier forming layer 36p may include a p-type dopant. Fifth and sixth channel material layers 92a and 92b are provided between the output terminal 80 and the ground terminal 82. Functions, materials, and arrangement of the fifth and sixth channel material layers 92a and 92b may be the same as those of the first and second channel material layers 34 and 38. The fifth channel material layer 92a contacts the output terminal 80, and the sixth channel material layer 92b contacts the ground terminal 82. Portions of the fifth and sixth channel material layers 92a and 92b may overlap each other. An n-type energy barrier forming layer 36n is provided in an overlapping area of the fifth and sixth channel material layers 92a and 92b. The n-type energy barrier forming layer 36n may be provided between the fifth and sixth channel material layers 92a and 92b. The n-type energy barrier forming layer 36n may include an n-type dopant. The p-type energy barrier forming layer 36p and the third and fourth channel material layers 90a and 90b may overlap each other in the same manner as the first and second channel material layers 34 and 38 and the energy barrier forming layer 36. Also, the n-type energy barrier forming layer 36n and the fifth and sixth channel material layers 92a and 92b may overlap each other in the same manner as the first and second channel material layers 34 and 38 and the energy barrier forming layer 36. The above-described through holes may be formed in an overlapping area of the third and fourth channel material layers 90a and 90b and the p-type energy barrier forming layer 36p. The through holes may be formed in the overlapping area of the fifth and sixth channel material layers 92a and 92b and the n-type energy barrier forming layer 36n. The n-type energy barrier forming layer 36n and the p-type energy barrier forming layer 36p may have opposite voltage polarities. Therefore, when a voltage having a certain polarity is applied to the n-type energy barrier forming layer 36n and the p-type energy barrier forming layer 36p, one of the n-type energy barrier forming layer 36n and the p-type energy barrier forming layer 36p may be turned off and the other may be turned on. When the polarity of the applied voltage is changed, the 'on' and 'off' status may become opposite. The third and fourth channel material layers 90a and 90b and the p-type energy barrier material layer 36p are covered by a gate insulating layer 86. Also, the fifth and sixth channel material layers 92a and 92b and the n-type energy barrier forming layer 36n are covered by the gate insulating layer 86. The gate insulating layer 86 may contact the ground terminal 82, the VDD terminal 84, and the output terminal 80. A gate electrode 88 is located on the gate insulating layer 86. The gate electrode 88 covers an overlapping area of the third and fourth channel material layers 90a and 90b and the p-type energy barrier forming layer 36p. The gate electrode 88 also covers an overlapping area of the fifth and sixth channel material layers 92a and 92b and the n-type energy barrier forming layer 36n. The third and fourth channel material layers 90a and 90b and the p-type energy barrier forming layer 36p may function as a channel. The channel, the VDD terminal 84, the output terminal 80, and the gate electrode 88 may form a p-type first semiconductor device. The fifth and sixth channel material layers 92a and 92b and the n-type energy barrier forming layer 36n may also function as a channel. The channel, the ground terminal 82, the output terminal 80, and the gate electrode 88 may form an n-type second semiconductor device. The first and second semiconductor devices include a common output terminal 80 and a common gate electrode 88. In the inverter 200, a value input to the VDD terminal 84 is changed according to a polarity of a voltage applied to the gate electrode 88 and output to the output terminal 80.

Referring to FIG. 25B, first and second insulating layers 32a and 32b, which are spaced apart, are formed on the substrate 30. The first and second insulating layers 32a and 32b may be formed of an identical material. The third channel material layer 90a, the p-type energy barrier forming layer 36p, and the fourth channel material layer 90b are sequentially stacked on the first insulating layer 32a. Hereinafter, the first insulating layer 32a and materials layers (the third channel material layer 90a, the p-type energy barrier forming layer 36p, and the fourth channel material layer 90b) sequentially stacked on the insulating layer 32a are referred to 'third stack.' The fifth channel material layer 92a, the n-type energy barrier forming layer 36n, and the sixth channel material layer 92b are sequentially stacked on the second insulating layer 32b. Hereinafter, the second insulating layer 32b, and material layers (the fifth channel material layer 92a, the n-type energy barrier forming layer 36n, and the sixth channel material layer 92b) sequentially stacked on the second insulating layer 32b are referred to as 'fourth stack.' The third and fourth stacks are sequentially covered by the gate insulating layer 86 and the gate electrode 88. The gate insulating layer 86 may completely cover upper surfaces and side surfaces of the third and fourth stacks. The gate electrode 88 formed on the gate insulating layer 86 covers the upper surfaces of the third and fourth stacks. In the third stack, the gate electrode 88 completely covers side surfaces of the third and fourth channel material layers 90a and 90b and side surfaces of the p-type energy barrier forming layer 36p, and partially covers side surfaces of the first insulating layer 32a. Also, in the fourth stack, the gate electrode 88 completely covers side surfaces of the fifth and sixth channel material layers 92a and 92b and side surfaces of the n-type energy barrier forming layer 36n, and partially covers side surfaces of the second insulating layer 32b.

As described above, the gate electrode 88 side gate electrodes 88a, 88b, and 88c that surrounds and faces the side surfaces of the p-type energy barrier forming layer 36p and the side surfaces of the n-type energy barrier forming layer 36n. Accordingly, when a voltage is applied via the gate electrode 88, a work function of the fourth channel material layer 90b or the sixth channel material layer 92b may be adjusted, and a field effect may occur directly on the p-type energy barrier forming layer 36p and the n-type energy barrier forming layer 36n through the side gate electrodes 88a, 88b, and 88c. Thus, operation voltage and SS values of the first and second semiconductor devices may be reduced.

In FIG. 25, a terminal connected to the third and fifth channel material layers 90a and 92a may be referred to as 'first terminal,' and a terminal connected to the fourth and sixth channel material layers 90b and 92b may be referred to as 'second terminal,' for convenience.

Figure 26:
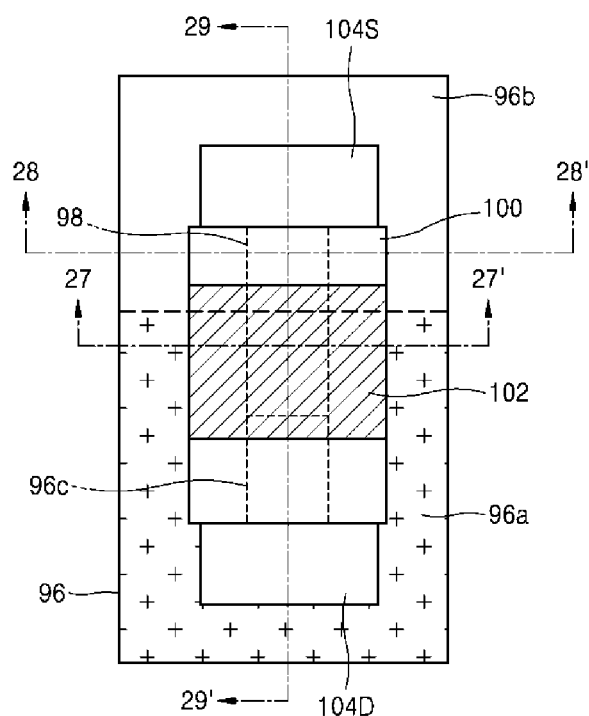
FIGS. 26, 27, 28A, 28B, 29A, and 29B are plan views and cross-sectional views of an electronic device according to some embodiments.

FIG. 26 is a plan view of an electronic device according to some embodiments.

Referring to FIG. 26, a source electrode 104S and a drain electrode 104D are on a substrate 96. The substrate 96 may be a semiconductor substrate, for example, a silicon substrate. The substrate 96 includes first and second areas 96a and 96b. The first and second areas 96a and 96b may be distinguished based on doping concentration. For example, doping concentration of the first area 96a may be higher than doping concentration of the second area 96b. "+" of the first area 96a indicates that the doping concentration of the first area 96a is relatively higher than that of the second area 96b. The source electrode 104S is in the second area 96b. The drain electrode 104D is in the first area 96a. An energy barrier forming layer 96c and a seventh channel material layer 98 are between the source and drain electrodes 104S and 104D. The energy barrier forming layer 96c may be a semiconductor layer. The energy barrier forming layer 96c is connected to the drain electrode 104D. The seventh channel material layer 98 may be formed of the same 2D material as the second channel material layer 38 described above. The seventh channel material layer 98 is connected to the source electrode 104S. A portion of the seventh channel material layer 98 is in the first area 96a. The portion of the seventh channel material layer 98 and a portion of the energy barrier forming layer 96c may overlap each other in the first area 96a. A gate insulating layer 100 and a gate electrode 102 are between the source and drain electrodes 104S and 104D. An entire surface of the gate electrode 102 overlap a portion of the gate insulating layer 100. The gate insulating layer 100 may completely overlap the seventh channel material layer 98 and the energy barrier forming layer 96c in an area between the source and drain electrodes 104S and 104D. The gate electrode 102 may partially overlap the seventh channel material layer 98 and the energy barrier forming layer 96c. The gate electrode 102 may overlap a portion of the first area 96a, and a portion of the second area 96b which is adjacent to the portion of the first area 96a.

Figure 27:
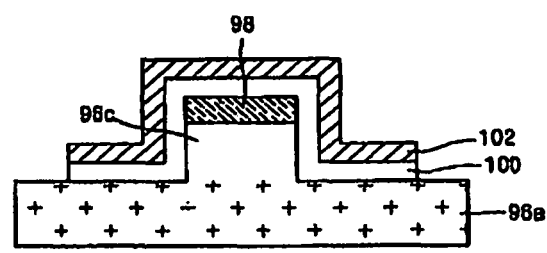

FIG. 27 is a cross-sectional view of the electronic device cut along a line 27-27' of FIG. 26.

Referring to FIG. 27, the energy barrier forming layer 96c that is formed of a semiconductor material and the seventh channel material layer 98 are sequentially stacked on a portion of the first area 96a of the substrate 96. The energy barrier forming layer 96c is not a layer that is separately formed from the first area 96a. The energy barrier forming layer 96c and the first area 96a form one body, that is, the energy barrier forming layer 96c extends from the first area 96a. Therefore, the energy barrier forming layer 96c is a portion of the substrate 96. The energy barrier forming layer 96c protrudes upward from the first area 96a. Doping concentration of the energy barrier forming layer 96c is lower than that of the first area 96a. The energy barrier forming layer 96c is a tunneling layer provided between the seventh channel material layer 98 and the first area 96a, and may function in the same manner as the energy barrier forming layer 36 described above. Accordingly, when a voltage application condition is satisfied during an operation of the electronic device, carriers may move through the energy barrier forming layer 96c from the seventh channel material layer 98 to the first area 96a, or vice versa. The gate insulating layer 100 and the gate electrode 102, which covers the energy barrier forming layer 96c and the seventh channel material layer 98, are sequentially stacked on the first area 96a. The gate insulating layer 100 covers side surfaces of the energy barrier forming layer 96c, and an upper surface and side surfaces of the seventh channel material layer 98. The gate electrode 102 covers the upper surface and the side surfaces of the seventh channel material layer 98, a portion of the side surfaces of the energy barrier forming layer 96c. Due to the gate insulating layer 100, the gate electrode 102 does not directly contact the seventh channel material layer 98 and the energy barrier forming layer 96c. A 2D material, such as the seventh channel material layer 98, does not exist between the gate electrode 102 and the side surfaces of the energy barrier forming layer 96c. Therefore, when the electronic device operates, an electric field may be directly applied on the energy barrier forming layer 96c through a side gate electrode that faces the energy barrier forming layer 96c of the gate electrode 102, and thus, a field effect may occur directly on the energy barrier forming layer 96c.

Figure 28A:
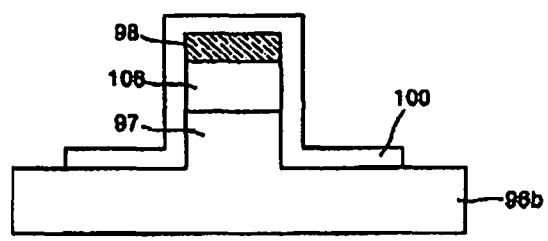
Figure 28B:
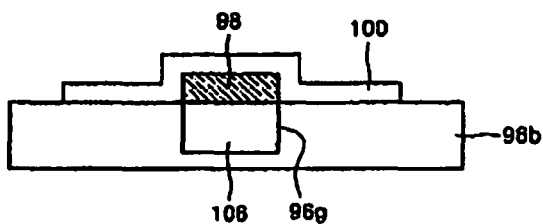

FIGS. 28A and 28B are cross-sectional views of the electronic device cut along a line 28-28' (a direction between the gate electrode 102 and the source electrode 104S) of FIG. 26.

Referring to FIG. 28A, a protrusion 97 is on the second area 96b of the substrate 96. The protrusion 97 is a portion of the second area 96b. The protrusion 97 is connected to the energy barrier forming layer 96c of FIG. 27. A material, a shape, and a size of the protrusion 97 may be the same as those of the energy barrier forming layer 96c. An interlayer insulating layer 106 and the seventh channel material layer 98 are sequentially stacked on the protrusion 97. The gate insulating layer 100 is on the second area 96b. The gate insulating layer 100 completely covers the protrusion 97 and material layers (the interlayer insulating layer 106 and the seventh channel material layer 98) that are stacked on the protrusion 97.

Alternatively, the interlayer insulating layer 106 may be buried in the second area 96b. FIG. 28B shows this example.

Referring to FIG. 28B, a groove 96g is formed in the second area 96b of the substrate 96, and the groove 96g is filled with the interlayer insulating layer 106. A depth of the groove 96g may be the same as a depth of the first area 96a, that is, a depth of a highly-doped area of the substrate 96. An upper surface of the interlayer insulating layer 106 may be flush with an upper surface of the second area 96b around the groove 96g. The seventh channel material layer 98 is formed on the interlayer insulating layer 106. The seventh channel material layer 98 may completely cover the upper surface of the interlayer insulating layer 106. The gate insulating layer 100, which covers the seventh channel material layer 98, is provided on the second area 96b.

Figure 29A:
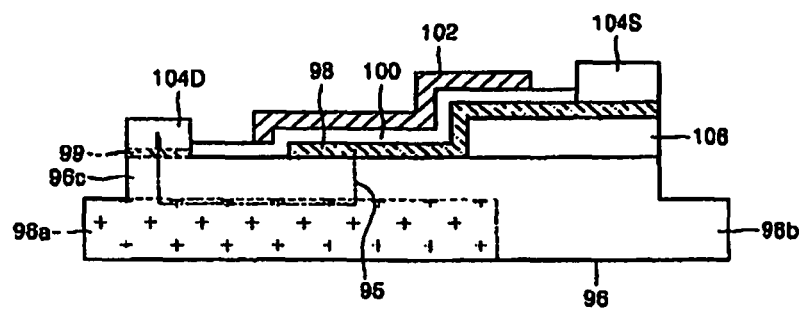
Figure 29B:
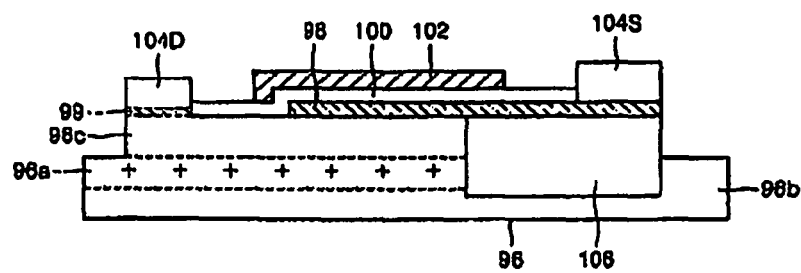

FIGS. 29A and 29B are cross-sectional views of the electronic device cut along a line 29-29' of FIG. 26.

FIG. 29A corresponds to FIG. 28A (the interlayer insulating layer 106 is on the substrate 96), and FIG. 29B corresponds to FIG. 28B (the interlayer insulating layer 106 is buried in the substrate 96).

Referring to FIG. 29A, the substrate 96 includes the first and second areas 96a and 96b, and the energy barrier forming layer 96c. The first and second areas 96a and 96b and the energy barrier forming layer 96c are connected to each other as one body and form the substrate 96. That is, the first and second areas 96a and 96b and the energy barrier forming layer 96c refer to different areas on the substrate 96. The first area 96a is adjacent to the second area 96b. The energy barrier forming layer 96c is on the first area 96a. The energy barrier forming layer 96c and the second area 96b are one consecutive body. That is, the energy barrier forming layer 96c and the second area 96b may have identical properties, such as doping concentration. The energy barrier forming layer 96c may be an upper area of the substrate 96. The seventh channel material layer 98, the interlayer insulating layer 106, the gate insulating layer 100, and the drain electrode 104D are provided on the substrate 96. A portion of the seventh channel material layer 98 directly contacts the energy barrier forming layer 96c of the substrate 96, and other portions of the seventh channel material layer 98 are spaced apart from the energy barrier forming layer 96c. The portions of the seventh channel material layer 98 that are spaced apart from the energy barrier forming layer 96c cover a side surface and an upper surface of the interlayer insulating layer 106. The gate insulating layer 100 contacts the seventh channel material layer 98. The gate insulating layer 100 extends onto a portion of the seventh channel material layer 98. Most of the seventh channel material layer 98 is covered by the gate insulating layer 100. The source electrode 104S is formed on a portion of the seventh channel material layer 98 which is not covered by the gate insulating layer 100. The source electrode 104S may contact a portion of the gate insulating layer 100 which extends onto the seventh channel material layer 98. The gate insulating layer 100 directly contacts a portion of the energy barrier forming layer 96c between the drain electrode 104D and the seventh channel material layer 98. The gate insulating layer 100 covers elements (the seventh channel material layer 98, the interlayer insulating layer 106, and the energy barrier forming layer 96c) between the drain electrode 104D and the source electrode 104S. The gate electrode 102 is formed on the gate insulating layer 100. The gate electrode 102 is spaced apart from the source and drain electrodes 104S and 104D. The gate electrode 102 partially covers the seventh channel material layer 98 and the energy barrier forming layer 96c. The energy barrier forming layer 96c forms an energy barrier with respect to the seventh channel material layer 98. A portion of the energy barrier forming layer 96c which contacts the seventh channel material layer 98 may be a tunneling area. A moving path 95 of carriers may be a path from the seventh channel material layer 98, through a portion of the energy barrier forming layer 96c which contacts the seventh channel material layer 98, the first area 96a, and a portion of the energy barrier forming layer 96c under the drain electrode 104D, to the drain electrode 104D. A moving direction of carriers may vary according to types of carriers.

Alternatively, the first area 96a of the substrate 96 may not exist in the FIGS. 27 and 29. That is, the substrate 96 may not have a highly-doped area. In this case, the energy barrier forming layer 96c itself may be a material layer that forms an energy barrier with respect to the seventh channel material layer 98 as well as a channel layer. Also, instead of directly contacting the energy barrier forming layer 96c, the drain electrode 104D may indirectly contact the energy barrier forming layer 96c via an intermediate material layer. For example, as shown in FIGS. 29A and B, a 2D material layer 99 may be formed between the drain electrode 104D and the energy barrier forming layer 96c. The 2D material layer 99 may be formed of graphene or any other known 2D material. The 2D material layer 99 may be a single layer or multiple layers. By including the 2D material layer 99, an energy band gap between the drain electrode 104D and the energy barrier forming layer 96c may be adjusted.

The interlayer insulating layer 106 of FIG. 29A may be buried in the substrate 96, as shown in FIG. 29B.

Specifically, referring to FIG. 29B, the interlayer insulating layer 106 may be buried to a depth from an upper surface of the substrate 96, that is, an upper surface of the energy barrier forming layer 96c, to the first area 96a. The interlayer insulating layer 106 may penetrate through the first area 96a and reach an area deeper than the first area 96a. The first area 96a may be an intermediate layer of the substrate 96. An upper surface of the buried interlayer insulating layer 106 may be flush with an upper surface of the energy barrier forming layer 96c. The upper surface of the interlayer insulating layer 106 is covered by the seventh channel material layer 98. Material layers (the gate insulating layer 100, the gate electrode 102, and the source electrode 104S) on the seventh channel material layer 98 may be arranged in the same manner as those in FIG. 29A.

Figure 30:
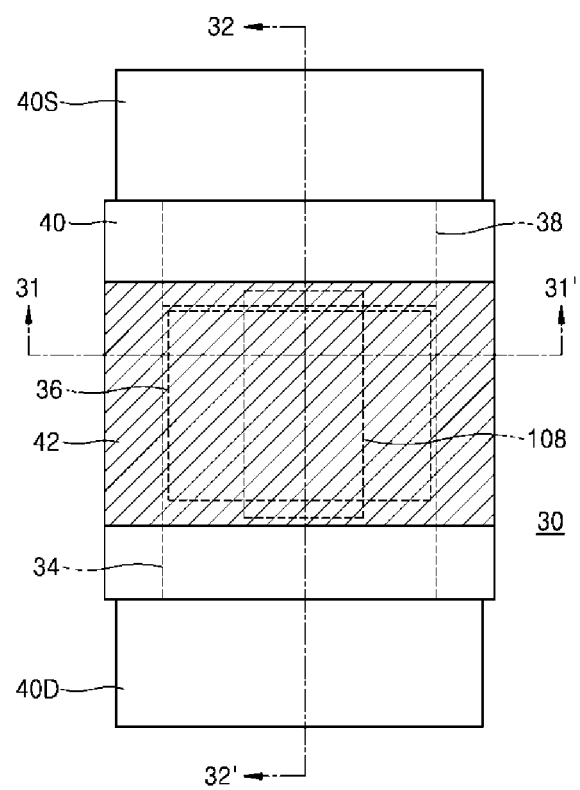
FIGS. 30, 31, and 32 are a plan view and cross-sectional views of an electronic device according to some embodiments, additionally including a lower gate electrode that is buried in an insulating layer.
Figure 31:
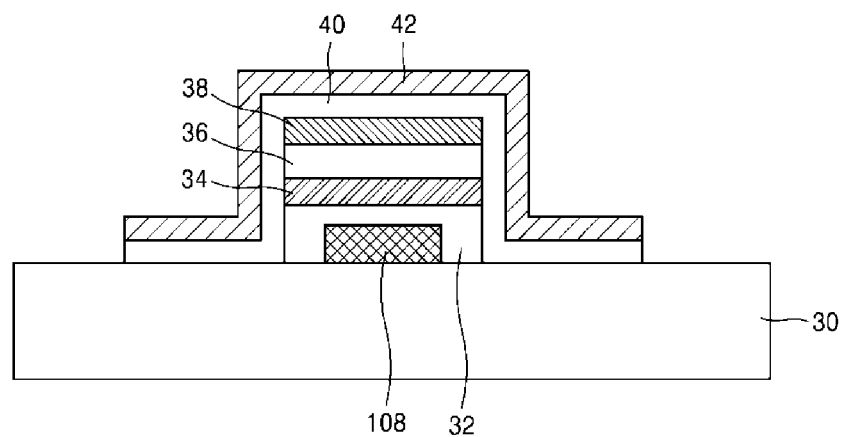
Figure 32:
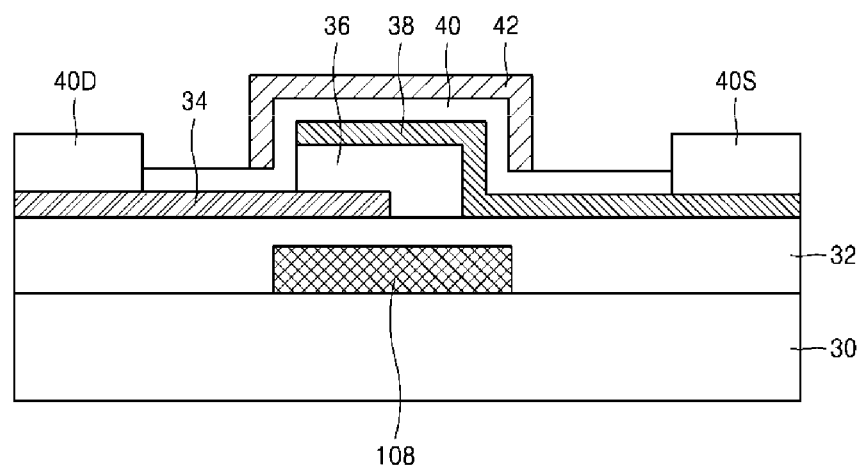

FIGS. 30 to 32 are a plan view and cross-sectional views of an electronic device according to some embodiments.

FIG. 30 is a plan view, FIG. 31 is a cross-sectional view of the electronic device cut along a line 31-31' of FIG. 30, and FIG. 32 is a cross-sectional view of the electronic device cut along a line 32-32' of FIG. 30. Only elements that are different from those of the above-described electronic devices will be described.

Referring to FIG. 30, the gate electrode 42 and a second gate electrode 108 are between source and drain electrodes 40S and 40D. Except for the second gate electrode 108, elements between the source and drain electrodes 40S and 40D may be arranged in the same manner as in an electronic device according to some embodiments, for example, as in the electronic device of FIG. 1. The second gate electrode 108 overlaps the gate electrode 42. The second gate electrode 108 completely overlaps a portion of the gate electrode 42. The second gate electrode 108 is spaced apart from the drain and source electrodes 40D and 40S. The second gate electrode 108 may overlap an area where the first and second channel material layers 34 and 38 overlap each other. The second gate electrode 108 may overlap the energy barrier forming layer 36. The second gate electrode 108 may be parallel to the first and second channel material layers 34 and 38.

Referring to FIG. 31, the second gate electrode 108 is on the substrate 30. The second gate electrode 108 is covered by the insulating layer 32. Accordingly, the second gate electrode 108 may be a buried gate electrode. The insulating layer 32 may directly contact the second gate electrode 108. The insulating layer 32 is formed on the substrate 30 and covers side surfaces and an upper surface of the second gate electrode 108. The insulating layer 32 may be a gate insulating layer with respect to the second gate electrode 108. Material layers (the first channel material layer 34, the energy barrier forming layer 36, the second channel material layer 38, the gate insulating layer 40, and the gate electrode 42) stacked on the insulating layer 32 may be arranged in the same manner as those of the electronic devices according to the above-described exemplary embodiments, for example, as those of the electronic device of FIG. 2. The second gate electrode 108 is under the first and second channel material layers 34 and 38 and the energy barrier forming layer 36. The second gate electrode 108 is also covered by the gate insulating layer 40 and the gate electrode 42. The second gate electrode 108 functions as a bottom gate, and the gate electrode 42 functions as a top gate. By including the second gate electrode 108, a work function of the first channel material layer 34, which is near the second gate electrode 108, may be adjusted. Therefore, an energy barrier between the first channel material layer 34 and the energy barrier forming layer 36 may be reduced, and consequently, an operation voltage of the electronic device may be further reduced during a turn-on operation. This indicates that an SS value of the electronic device may be further reduced, and thus, performance of the electronic device may be further improved.

Referring to FIG. 32, the second gate electrode 108 is formed on a portion of the substrate 30. The insulating layer 32 that covers the second gate electrode 108 is on the substrate 30. The insulating layer 32 completely covers an upper surface of the substrate 30. An upper surface of the insulating layer 32 is flat. Elements provided on the insulating layer 32 may be the same as those in the electronic devices according to the above-described exemplary embodiments, for example, as those in the electronic device of FIG. 3. A horizontal width of the second gate electrode 108 may be the same as or greater than a horizontal width of the energy barrier forming layer 36. In FIG. 32, the first and second channel material layers 34 and 38 are spaced apart in a horizontal direction, and a space between the first and second channel material layers 34 and 38 is filled with the energy barrier forming layer 36. Therefore, the second gate electrode 108 may apply an electric field directly on the energy barrier forming layer 36, which is in the space between the first and second channel material layers 34 and 38, and thus generate a field effect.

Figure 33:
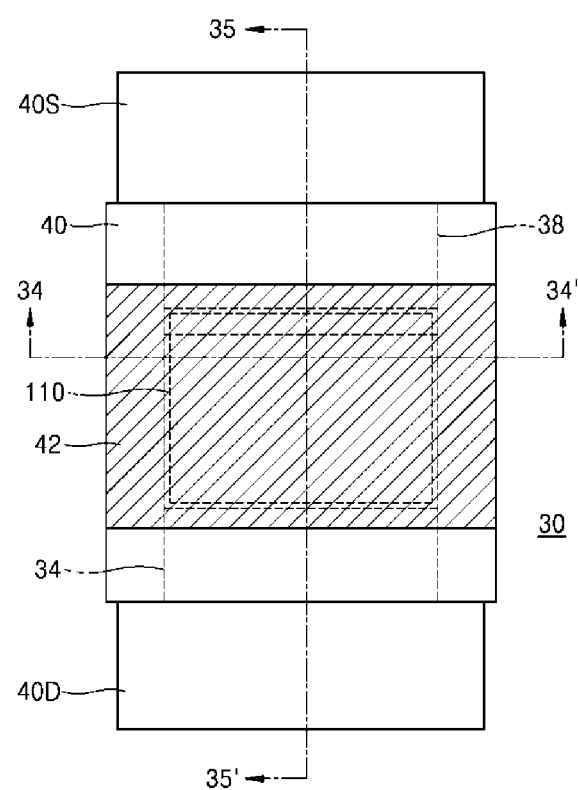
FIGS. 33, 34, and 35 are a plan view and cross-sectional views of an electronic device according to some embodiments, in which different types of two energy barrier forming layers are vertically stacked.

FIG. 33 is a plan view of an electronic device according to some embodiments.

Referring to FIG. 33, portions of the first and second channel material layers 34 and 38 overlap each other between the source and drain electrodes 40S and 40D. An energy barrier forming layer 110 is provided at an area where the portions of the first and second channel material layers 34 and 38 overlap each other. Elements other than the energy barrier forming layer 110 in the electronic device of FIG. 33 may be the same as those of the electronic devices according to the above-described exemplary embodiments, for example, the elements of the electronic device of FIG. 1.

Figure 34:
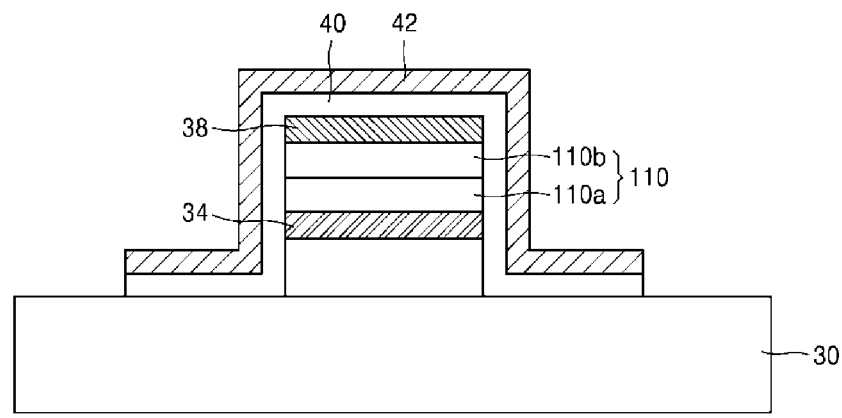

FIG. 34 is a cross-sectional view of the electronic device that is cut along a line 34-34' of FIG. 33.

Referring to FIG. 34, the energy barrier forming layer 110 is between the first and second channel material layers 34 and 38 that are sequentially stacked. The energy barrier forming layer 110 includes a first material layer 110a and a second material layer 110b that are sequentially stacked. The first material layer 110a may be, for example a p-type material layer. The second material layer 110b may be a material layer of a type opposite to that of the first material layer 11a, for example, an n-type material layer. The energy barrier forming layer 110 may be a p-n junction layer. The p-type material layer may be, for example, a p-type semiconductor layer. The n-type material layer may be, for example, an n-type semiconductor layer. Elements other than the energy barrier forming layer 110 in the electronic device of FIG. 34 may be the same as those of the electronic devices according to the above-described exemplary embodiments, for example, the elements of the electronic device of FIG. 2. The electronic device that includes the energy barrier forming layer 110 may be used as a light-emitting diode (LED) or a solar battery. In this case, a material layer for increasing the efficiency of the LED or the solar battery may be provided between the first channel material layer 34 and the energy barrier forming layer 110 or between the second channel material layer 38 and the energy barrier forming layer 110. When the electronic device that includes the energy barrier forming layer 110 is used as the LED or the solar battery, the substrate 30 or the gate electrode 42 may be formed of a material that is transparent with respect to light.

Figure 35:
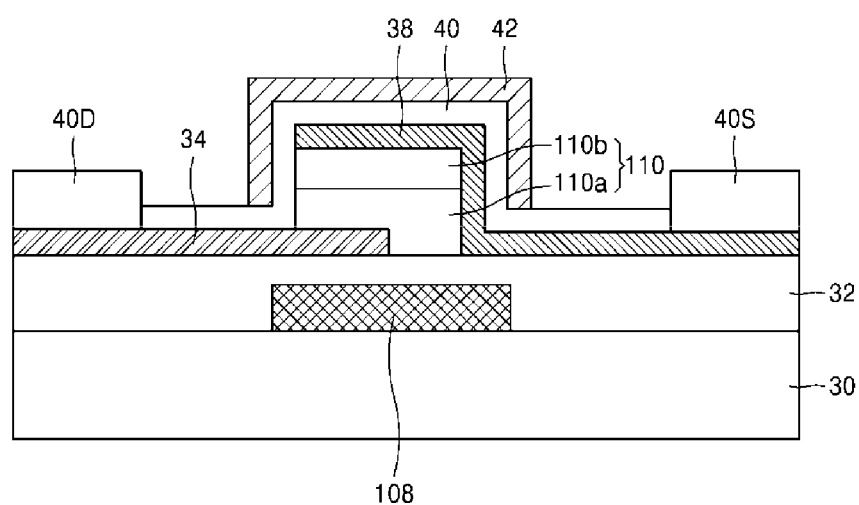

FIG. 35 is a cross-sectional view of the electronic device that is cut along a line 35-35' of FIG. 33.

Referring to FIG. 35, other than a feature that the energy barrier forming layer 110 is provided between the first and second channel material layers 34 and 38 and includes the first and second material layers 110a and 110b that are sequentially stacked, other features may be the same as those in the electronic devices according to the above-described exemplary embodiments, for example, as those in the electronic device of FIG. 3. When the electronic device of FIG. 35 is used as the LED or the solar battery, the substrate 30 or the gate electrode 42 may be formed of a material that is transparent with respect to light.

Figure 36:
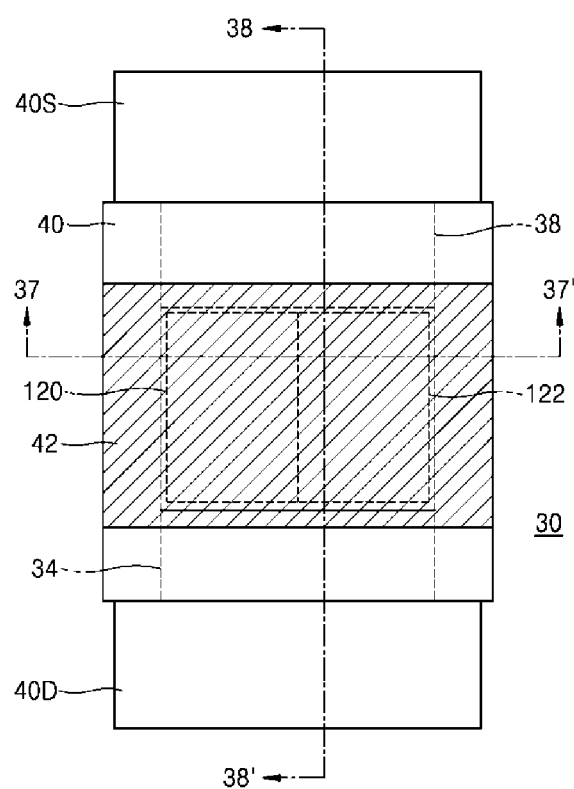
FIGS. 36, 37, and 38 are a plan view and cross-sectional views of an electronic device according to some embodiments, in which different types of two energy barrier forming layers are horizontally stacked.

FIG. 36 is a plan view of an electronic device according to some embodiments.

Referring to FIG. 36, a first energy barrier forming layer 120 and a second energy barrier forming layer 122 are arranged between the source and drain electrodes 40S and 40D. The first and second energy barrier forming layers 120 and 122 are adjacent to each other. A location of the first and second energy barrier forming layers 120 and 122 may be the same as that of the above-described energy barrier forming layer, for example, a location of the energy barrier forming layer 36 of the electronic device of FIG. 1. One of the first energy barrier forming layer 120 and the second energy barrier forming layer 122 may be a p-type material layer, and the other may be an n-type material layer. Elements other than the first and second energy barrier forming layers 120 and 122 in the electronic device of FIG. 36 may be the same as those in the electronic devices according to the above-described exemplary embodiments, for example, as those in the electronic device of FIG. 1. The electronic device FIG. 36 may be used as an ambipolar device.

Figure 37:
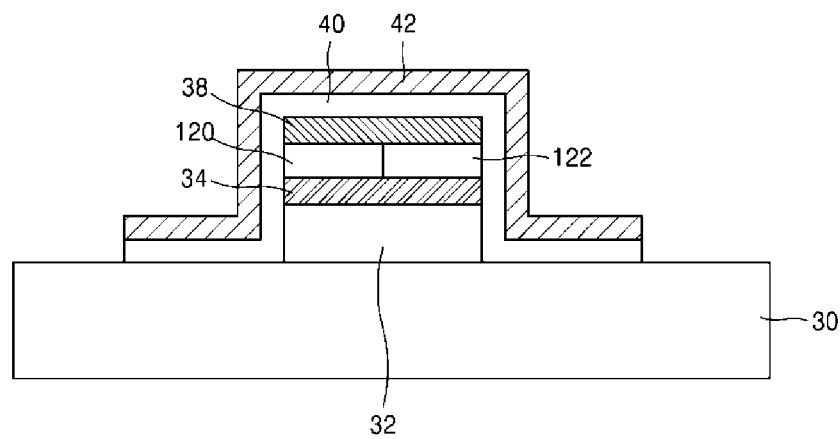

FIG. 37 is a cross-sectional view of the electronic device cut along a line 37-37' of FIG. 36.

Referring to FIG. 37, the first and second channel material layers 34 and 38 are sequentially stacked on the insulating layer 32. The first and second energy barrier forming layers 120 and 122 are provided between the first and second channel material layers 34 and 38. The first and second energy barrier forming layers 120 and 122 are horizontally arranged on the first channel material layer 34. The first and second energy barrier forming layers 120 and 122 may contact each other. Upper surfaces of the first and second energy barrier forming layers 120 and 122 are covered by the second channel material layer 38. Other than a feature that the first and second energy barrier forming layers 120 and 122 is provided between the first and second channel material layers 34 and 38 in the electronic device of FIG. 37, other features may be the same as those in the electronic devices according to the above-described exemplary embodiments, for example, as those in the electronic device of FIG. 2.

Figure 38:
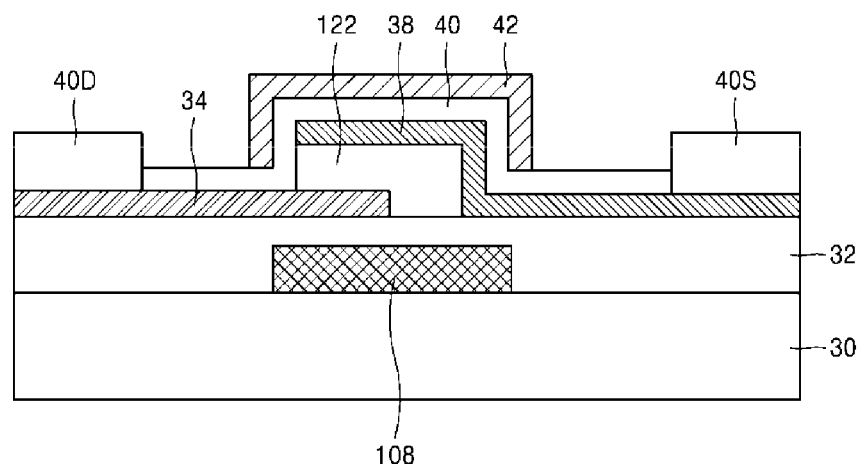

FIG. 38 is a cross-sectional view of the electronic device cut along a line 38-38' of FIG. 36.

Other than a feature that the second energy barrier material layer 122 is between the first and second channel material layers 34 and 38 in the electronic device of FIG. 37, other features may be the same as those in the electronic devices according to the above-described exemplary embodiments, for example, as those in the electronic device of FIG. 3.

Figure 39:
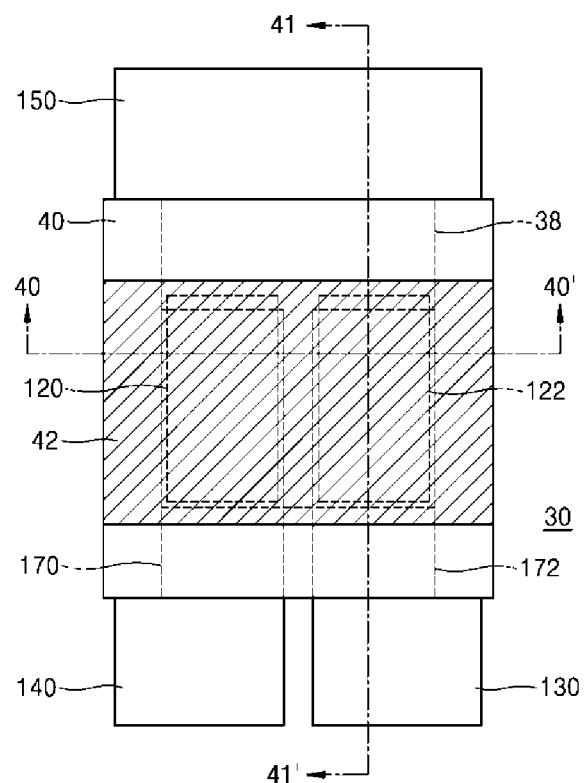
FIGS. 39, 40, and 41 are a plan view and cross-sectional views of an inverter including an electronic device according to some embodiments.

FIG. 39 is a plan view of an inverter including an electronic device according to some embodiments. The inverter of FIG. 39 includes one of the above-described electronic devices.

Referring to FIG. 39, a ground terminal 140, a VDD terminal 130, and an output terminal 150 are arranged on the substrate 30. The ground terminal 140 and the VDD terminal 130 are adjacent to each other but spaced apart. The ground terminal 140 and the VDD terminal 130 may face the output terminal 150. The second channel material layer 38 and eighth and ninth channel material layer 170 and 172 are provided between the output terminal 150 and two terminals (VDD terminal 130 and the ground terminal 140). The eighth and ninth channel material layer 170 and 172 may include 2D materials. The eighth and ninth channel material layer 170 and 172 may be the same material as the first channel material layer 34 of FIG. 1. The eighth channel material layer 170 and the ninth channel material layer 172 are spaced apart and in parallel to each other. The eighth and ninth channel material layer 170 and 172 may be in parallel to the second channel material layer 38. The second channel material layer 38 is connected to the output terminal 150. The eighth channel material layer 170 is connected to the ground terminal 140. The ninth channel material layer 172 is connected to the VDD terminal 130. A portion of the second channel material layer 38 overlaps a portion of the eighth channel material layer 170. Another portion of the second channel material layer 38 overlaps a portion of the ninth channel material layer 172. The first and second energy barrier forming layer 120 and 122 are provided between the output terminal 150 and the two terminals (the VDD terminal 130 and the ground terminal 140). The first and second energy barrier forming layers 120 and 122 are spaced apart. One of the first and second energy barrier forming layers 120 and 122 is a p-type material layer, and the other may be an n-type material layer. The first energy barrier forming layer 120 is arranged in an area where the second channel material layer 38 overlaps the eighth channel material layer 170. Accordingly, the first energy barrier forming layer 120, the second channel material layer 38, and the eighth channel material layer 170 overlap each other. The second energy barrier forming layer 122 is arranged in an area where the second channel material layer 38 overlaps the ninth channel material layer 172. Accordingly, the second energy barrier forming layer 122, the second channel material layer 38, and the ninth channel material layer 172 overlap each other. The gate insulating layer 40 and the gate electrode 42 are provided between the output terminal 150 and the two terminals (the VDD terminal 130 and the ground terminal 140). An input voltage may be applied through the gate electrode 42. The gate electrode 42 may completely overlap an entire area of the first and second energy barrier forming layers 120 and 122. The gate electrode 42 may completely overlap an area where the second channel material layer 38 overlaps the eighth channel material layer 170. Also, the gate electrode 42 may completely overlap an area where the second channel material layer 38 overlaps the ninth channel material layer 172. The gate electrode 42 may be arranged in a direction that intersects the first, eighth, and ninth channel material layers 38, 170, and 172. The gate insulating layer 40 may completely overlap material layers (the second channel material layer 38, the gate electrode 42, the first and second energy barrier forming layers 120 and 122, the VDD terminal 130, and the eighth and ninth channel material layers 170 and 172) between the output terminal 150 and the two terminals (the VDD terminal 130 and the ground terminal 140).

Figure 40:
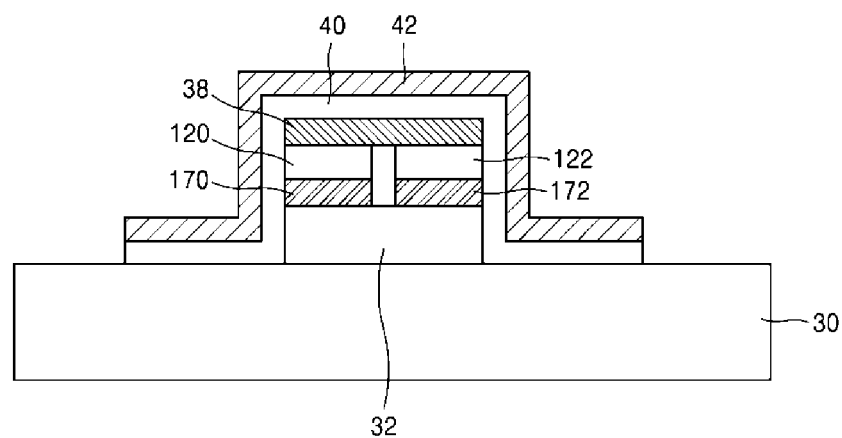

FIG. 40 is a cross-sectional view of the electronic device that is cut along a line 40-40' of FIG. 39.

Referring to FIG. 40, the insulating layer 32 is formed on the substrate 30. The eighth and ninth channel material layer 170 and 172 are on the insulating layer 32. The eighth and ninth channel material layer 170 and 172 are spaced apart. The first energy barrier forming layer 120 is on the eighth channel material layer 170. Also, the second energy barrier forming layer 122 is on the ninth channel material layer 172. Upper surfaces of the eighth and ninth channel material layer 170 and 172 are covered by the second channel material layer 38. The insulating layer 32 and the material layers (the second channel material layer 38, the first and second energy barrier forming layers 120 and 122, and the eighth and ninth channel material layers 170 and 172) that are stacked on the insulating layer 32 are covered by the gate insulating layer 40. The gate insulating layer 40 is formed on the substrate 30 and covering side surfaces of the insulating layer 32 and side surfaces of the material layers (the second channel material layer 38, the gate electrode 42, the first and second energy barrier forming layers 120 and 122, the VDD terminal 130, and the eighth and ninth channel material layers 170 and 172), and an upper surface of the second channel material layer 38. The gate electrode 42 is formed on the gate insulating layer 40. The gate electrode 42 partially covers the side surfaces of the insulating layer 32. The gate electrode 42 covers the material layers (the second channel material layer 38, the gate electrode 42, the first and second energy barrier forming layers 120 and 122, the VDD terminal 130, and the eighth and ninth channel material layers 170 and 172) that are stacked on the insulating layer 32. Since the gate electrode 42 may face the side surfaces of the first and second energy barrier forming layers 120 and 122 as described above, an electric field may be directly applied to the first and second energy barrier forming layers 120 and 122 so that a field effect occurs directly on the first and second energy barrier forming layers 120 and 122.

Figure 41:
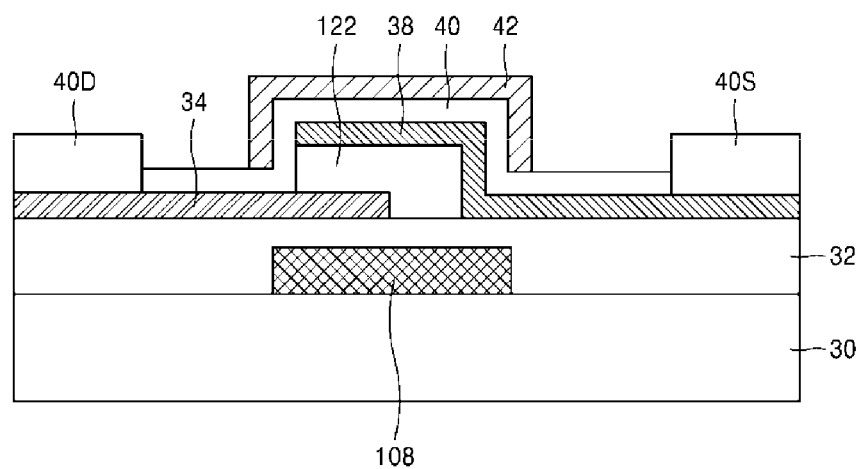

FIG. 41 is a cross-sectional view of the electronic device that is cut along a line 41-41' of FIG. 39.

Referring to FIG. 41, an upper surface of the substrate 30 is covered by the insulating layer 32. The second channel material layer 38 and the ninth channel material layer 172 are arranged on the insulating layer 32. The second channel material layer 38 and the ninth channel material layer 172 are spaced apart. The second energy barrier forming layer 122 is formed on a portion of the insulating layer 32 between the second channel material layer 38 and the ninth channel material layer 172. The second energy barrier forming layer 122 extends onto a portion of the ninth channel material layer 172. The second channel material layer 38 covers a side surface of the second energy barrier forming layer 122, which is adjacent to the second channel material layer 38, and an upper surface of the second energy barrier forming layer 122. The VDD terminal 130 is formed on the ninth channel material layer 172. The VDD terminal 130 is spaced apart from the second energy barrier forming layer 122. The output terminal 150 is on the second channel material layer 38. The output terminal 150 is spaced apart from the second energy barrier forming layer 122. The gate insulating layer 40 and the gate electrode 42 is between the VDD terminal 130 and the output terminal 150. The VDD terminal 130 and the output terminal 150 may contact the gate insulating layer 40. The gate insulating layer 40 covers a portion of the ninth channel material layer 172 between the VDD terminal 130 and the second energy barrier forming layer 122, a side surface of the second energy barrier forming layer 122 which is adjacent to the VDD terminal 130, and the second channel material layer 38. The gate electrode 42 is formed on the gate insulating layer 40. The gate electrode 42 covers an area where the second channel material layer 38, the ninth channel material layer 172, and the second energy barrier forming layer 122 overlap each other. The gate electrode 42 has a side surface that faces a side surface of the second energy barrier forming layer 122.

In FIGS. 39 to 41, terminals that are connected that are connected to the eighth and ninth channel material layer 170 and 172 may be referred to as 'first terminal,' and a terminal connected to the second channel material layer 38 may be referred to as 'second terminal.'

An electronic device according to some embodiments includes an energy barrier forming layer between channels that include vertically arranged 2D materials (for example, graphene). Accordingly, current that flows when the electronic device is turned off, that is, off current may be prevented. In the electronic device, a work function of a channel that includes the 2D materials may be adjusted by adjusting a voltage applied to a gate. Then, current may flow easily by reducing an energy barrier between the channel and the energy barrier forming layer. Therefore, a ratio between current flow (turn on current) when the electronic device is on and current flow (off current) when the electronic device is turned off may be significantly increased.

Also, a gate electrode in the electronic device has a portion that faces a side surface of the energy barrier forming layer, that is, a side gate electrode. Then, when an operation voltage is applied to the gate electrode, an electric field may be applied directly on the energy barrier forming layer through the side gate electrode so that a field effect occurs directly on the energy barrier forming layer. Accordingly, the energy barrier between the energy barrier forming layer and the channel that includes the 2D materials may be relatively easily adjusted. Therefore, an operation voltage of the electronic device may be reduced more by only adjusting a work function of the channel that includes the 2D material, compared to when adjusting the energy barrier between the channel and the energy barrier forming layer.

Since the operation voltage of the electronic device is reduced, an SS value of the electronic device may also be lower than when the gate electrode does not have the side gate electrode.

Also, since a thickness of the energy barrier forming layer between the channels is few nm, the energy barrier forming layer merely affects mobility of carriers that move through the channels. Therefore, the mobility of the electronic device may be approximately the same as the unique mobility of the 2D material.

While some embodiments have been described with reference to the figures, it will be understood by those of ordinary skill in the art that various changes in form and details may be made therein without departing from the spirit and scope as defined by the following claims.

What is claimed is:

1. An electronic device comprising:
  a substrate;
  an energy barrier forming layer on the substrate;
  an upper channel material layer on the substrate, the upper channel material layer including a two-dimensional (2D) material, the upper channel material layer at least partially covering an upper surface of the energy barrier forming layer;
  a lower channel material layer on the substrate;

a gate electrode that covers the upper channel material layer and the energy barrier forming layer, the gate electrode including a side gate electrode portion that faces a side surface of the energy barrier forming layer;
a drain electrode on the substrate; and
a source electrode on the upper channel material layer,
wherein the lower channel material layer is in direct contact with only the drain electrode of the source electrode and the drain electrode and is separated from the source electrode, and
wherein the upper channel material layer is in direct contact with only the source electrode of the source electrode and the drain electrode and is separated from the drain electrode.

2. The electronic device of claim 1, wherein the lower channel material layer is isolated from contact with the upper channel material layer, the lower channel material layer is at least partially located between the energy barrier forming layer and the substrate.

3. The electronic device of claim 1, further comprising:
an interlayer insulating layer,
wherein the substrate includes a semiconductor substrate that includes separate areas, each separate area associated with a different doping concentration, the interlayer insulating layer is on a low doping concentration area of the separate areas, and
at least a portion of the upper channel material layer and at least a portion of the source electrode are on the interlayer insulating layer.

4. The electronic device of claim 1, further comprising:
an interlayer insulating layer,
wherein the substrate includes a semiconductor substrate that includes separate areas, each separate area of the semiconductor substrate includes a different doping concentration, the interlayer insulating layer is buried in the semiconductor substrate, and
the buried interlayer insulating layer is in contact with a high doping concentration area of the separate areas of the semiconductor substrate.

5. The electronic device of claim 1, wherein the energy barrier forming layer includes a first material layer and a second material layer,
wherein one material layer of the first material layer and the second material layer includes a p-type material layer, and another material layer of the first material layer and the second material layer includes an n-type material layer.

6. The electronic device of claim 1, further comprising:
a hole penetrating through at least a portion of each of the upper channel material layer and the energy barrier forming layer,
wherein the gate electrode includes a portion which faces a side surface of the energy barrier forming layer, the side surface being exposed through the hole.

7. The electronic device of claim 1, further comprising:
a hole penetrating through at least a portion of each of the upper channel material layer, the energy barrier forming layer, and the lower channel material layer,
wherein the gate electrode includes a portion which faces a side surface of the energy barrier forming layer, the side surface being exposed through the hole.

8. The electronic device of claim 1, wherein,
the energy barrier forming layer comprises a first material layer and a second material layer, and
one material layer of the first material layer and the second material layer includes a p-type material layer, and another material layer of the first material layer and the second material layer includes an n-type material layer.

9. The electronic device of claim 1, further comprising an insulating layer between the substrate and the lower channel material layer.

10. The electronic device of claim 3, wherein,
a high doping concentration area of the separate areas of the semiconductor substrate is located beneath a surface of the semiconductor substrate, and
a portion of the upper channel material layer and a portion of the drain electrode at least partially overlap the high doping concentration area.

11. The electronic device of claim 3, further comprising a 2D material layer between the drain electrode and the substrate.

12. The electronic device of claim 10, wherein a portion of the semiconductor substrate is located between a high doping concentration area of the separate areas of the semiconductor substrate and the upper channel material layer, the portion of the semiconductor substrate includes the energy barrier forming layer.

13. The electronic device of claim 8, wherein the first material layer and the second material layer are horizontally arranged or vertically stacked.

14. The electronic device of claim 9, further comprising a lower gate electrode that is buried in the insulating layer.

15. The electronic device of claim 9, wherein,
the energy barrier forming layer comprises a first material layer and a second material layer, and
one material layer of the first material layer and the second material layer includes a p-type material layer, and another material layer of the first material layer and the second material layer includes an n-type material layer.

16. The electronic device of claim 15, wherein,
the first and second material layers are vertically stacked, and
the substrate or the gate electrode is transparent with respect to light.

17. An electronic device comprising:
a first semiconductor device; and
a second semiconductor device,
wherein each of the first and second semiconductor devices includes,
a substrate;
an energy barrier forming layer on the substrate, wherein one energy barrier forming layer of the first semiconductor device or the energy barrier forming layer of the second semiconductor device includes a p-type material layer, and the other energy barrier forming layer of the first semiconductor device or the energy barrier forming layer of the second semiconductor device includes an n-type material layer;
an upper channel material layer on the substrate, the upper channel material layer including a two-dimensional (2D) material, the upper channel material layer at least partially covering an upper surface of the energy barrier forming layer;
a lower channel material layer on the substrate;
a gate electrode that covers the upper channel material layer and the energy barrier forming layer, the gate electrode including a side gate electrode portion that faces a side surface of the energy barrier forming layer;
a first terminal on the substrate; and
a second terminal on the upper channel material layer, wherein the first terminals or the second terminals of the first and second semiconductor devices are connected to each other, and the gate electrodes of the first and second semiconductor devices are connected to each other, wherein the lower channel material layer is in direct contact with only the first terminal of the first terminal and the second terminal and is separated from the second terminal, and wherein the upper channel material layer is in direct contact with only the second terminal of the first terminal and the second terminal and is separated from the first terminal.

18. The electronic device of claim 17, wherein,
the upper channel material layers of the first semiconductor device and the second semiconductor device are connected to each other and form one body, and
the second terminals of the first semiconductor device and the second semiconductor device are connected to each other.

19. The electronic device of claim 17, wherein the first terminals of the first semiconductor device and the second semiconductor device are connected to each other.

20. The electronic device of claim 17, the lower channel material layer is isolated from contact with the upper channel material layer, the lower channel material layer is at least partially located between the energy barrier forming layer and the substrate.

21. The electronic device of claim 17, further comprising an insulating layer between the substrate and the lower channel material layer.

22. The electronic device of claim 21, further comprising a lower gate electrode that is buried in the insulating layer.

23. An electronic device comprising:
a substrate;
an energy barrier forming layer on the substrate;
an upper channel material layer on the substrate, the upper channel material layer including a two-dimensional (2D) material, the upper channel material layer at least partially covering an upper surface of the energy barrier forming layer;
a gate insulating layer on the substrate;
a gate electrode that covers the upper channel material layer and the energy barrier forming layer, the gate electrode including a side gate electrode portion that faces a side surface of the energy barrier forming layer;
a drain electrode on the substrate; and
a source electrode on the upper channel material layer,
wherein the gate insulating layer includes a side portion that covers a side surface of the energy barrier forming layer and the side gate electrode portion is direct contact with the side portion of the gate insulating layer; and
wherein the upper channel material layer is in direct contact with only the source electrode of the source electrode and the drain electrode.

24. A method of manufacturing an electronic device, the method comprising:
forming an energy barrier forming layer on a substrate;
forming, on the substrate, an upper channel material layer that covers an upper surface of the energy barrier forming layer, the upper channel material layer including a two-dimensional (2D) material layer;
forming a lower channel material layer on the substrate;
forming a gate electrode that covers the energy barrier forming layer and the upper channel material layer, such that a portion of the gate electrode faces a side surface of the energy barrier forming layer;
forming a drain electrode on the substrate; and
forming a source electrode on the upper channel material layer,
wherein the lower channel material layer is in direct contact with only the drain electrode of the source electrode and the drain electrode and is separated from the source electrode; and
wherein the upper channel material layer is in direct contact with only the source electrode of the source electrode and the drain electrode and is separated from the drain electrode.

25. The method of claim 24, wherein a portion of the lower channel material layer is formed between the energy barrier forming layer and the substrate.

26. The method of claim 24, wherein,
the substrate includes a semiconductor substrate, and
the method further includes
forming an area of the semiconductor substrate which includes a relatively high doping concentration in the semiconductor substrate;
forming an interlayer insulating layer on an area of the semiconductor substrate which includes a relatively low doping concentration; and
forming a portion of the upper channel material layer and the source electrode on the interlayer insulating layer.

27. The method of claim 24, wherein,
the substrate includes a semiconductor substrate, and
the method further includes
forming an area of the semiconductor substrate which includes a relatively high doping concentration in the semiconductor substrate; and
burying an interlayer insulating layer in the semiconductor substrate.

28. The method of claim 24, wherein,
the energy barrier forming layer includes a first material layer and a second material layer, and
one material layer of the first material layer and the second material layer includes a p-type material layer, and another material layer of the first material layer and the second material layer includes an n-type material layer.

29. The method of claim 25, wherein,
the energy barrier forming layer includes a first material layer and a second material layer, and
one material layer of the first material layer and the second material layer includes a p-type material layer, and another material layer of the first material layer and the second material layer includes an n-type material layer.

30. The method of claim 25, further comprising forming an insulating layer between the substrate and the lower channel material layer.

31. The method of claim 30, further comprising forming a buried gate electrode in the insulating layer.

32. The method of claim 24, further comprising:
forming a hole that penetrates through at least a portion of each of the upper channel material layer and the energy barrier forming layer, before forming the gate electrode,
wherein the gate electrode is formed such that a portion of the gate electrode faces a side surface of the energy barrier forming layer, the side surface being exposed through the hole.

33. The method of claim 25, further comprising:
forming a hole penetrating through at least a portion of each of the upper channel material layer, the energy barrier forming layer, and the lower channel material layer, before forming the gate electrode,
wherein the gate electrode is formed such that a portion of the gate electrode faces a side surface of the energy barrier forming layer, the side surface being exposed through the hole.

34. The method of claim 25, wherein the upper and lower channel material layers are formed via at least one of a transfer printing method or a direct growth method.

* * * * *